(12) United States Patent
Kawashima

(10) Patent No.: US 10,978,381 B2
(45) Date of Patent: Apr. 13, 2021

(54) SEMICONDUCTOR DEVICE

(71) Applicant: Denso Corporation, Kariya (JP)

(72) Inventor: Takanori Kawashima, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 16/274,625

(22) Filed: Feb. 13, 2019

(65) Prior Publication Data

US 2019/0259690 A1 Aug. 22, 2019

(30) Foreign Application Priority Data

Feb. 16, 2018 (JP) .............................. JP2018-026032
Oct. 29, 2018 (JP) .............................. JP2018-202910

(51) Int. Cl.
*H01L 23/49* (2006.01)
*H01L 23/495* (2006.01)
(Continued)

(52) U.S. Cl.
CPC .... *H01L 23/49575* (2013.01); *H01L 23/3121* (2013.01); *H01L 23/367* (2013.01); *H01L 23/3735* (2013.01); *H01L 23/49537* (2013.01); *H01L 23/49562* (2013.01); *H01L 23/49568* (2013.01); *H01L 24/33* (2013.01); *H01L 24/49* (2013.01); *H01L 25/043* (2013.01);
(Continued)

(58) Field of Classification Search
CPC ........... H01L 23/49575; H01L 25/0657; H01L 25/074; H01L 25/043; H01L 23/49537; H01L 23/49562; H01L 23/49568; H01L 24/49; H01L 23/3121; H01L 24/33; H01L 2224/48247; H01L 25/165
See application file for complete search history.

(56) References Cited

U.S. PATENT DOCUMENTS 6,133,637 A * 10/2000 Hikita .................... G01P 3/488
257/666
2002/0195697 A1* 12/2002 Mess ................. H01L 23/49575
257/686

(Continued)

FOREIGN PATENT DOCUMENTS

JP 2016-036047 A 3/2016
JP 5975180 B2 8/2016
WO 2011/064841 A1 6/2011

*Primary Examiner* — Charles D Garber
*Assistant Examiner* — S M Sohel Imtiaz
(74) *Attorney, Agent, or Firm* — Dinsmore & Shohl LLP

(57) ABSTRACT

A semiconductor device includes: a first semiconductor element including a first signal electrode; a second semiconductor element, laminated on the first semiconductor element, including a second signal electrode; a sealing body; a first signal terminal connected to the first signal electrode; and a second signal terminal connected to the second signal electrode, wherein: the first signal terminal and the second signal terminal project from the sealing body and extend in a first direction; the first signal terminal and the second signal terminal are distanced from each other in a second direction; the first signal electrode and the second signal electrode are placed at different positions in the second direction; the first signal electrode is provided closer to the first signal terminal than to the second signal terminal; and the second signal electrode is provided closer to the second signal terminal than to the first signal terminal.

4 Claims, 19 Drawing Sheets

(51) Int. Cl.

| | |
|---|---|
| *H01L 23/367* | (2006.01) |
| *H01L 23/373* | (2006.01) |
| *H01L 23/00* | (2006.01) |
| *H01L 23/31* | (2006.01) |
| *H01L 25/04* | (2014.01) |
| *H01L 25/07* | (2006.01) |
| *H01L 25/065* | (2006.01) |

(52) U.S. Cl.
CPC ........ *H01L 25/0657* (2013.01); *H01L 25/074* (2013.01); *H01L 2224/0555* (2013.01); *H01L 2224/48247* (2013.01)

(56) References Cited

U.S. PATENT DOCUMENTS

| | | | |
|---|---|---|---|
| 2007/0138616 A1* | 6/2007 | Fujisawa | H01L 23/49827 257/690 |
| 2007/0200205 A1* | 8/2007 | Filoteo, Jr. | H01L 23/49575 257/666 |
| 2008/0211110 A1* | 9/2008 | Otsuka | H01L 24/06 257/777 |
| 2009/0001574 A1* | 1/2009 | Fang | H01L 24/31 257/738 |
| 2009/0057891 A1* | 3/2009 | Nishimura | H01L 23/49575 257/737 |
| 2012/0228757 A1* | 9/2012 | Kitami | F28D 15/0266 257/713 |
| 2016/0027711 A1* | 1/2016 | Harada | H01L 23/3735 257/698 |
| 2016/0260691 A1* | 9/2016 | Aoshima | H01L 23/49537 |

\* cited by examiner

SEMICONDUCTOR DEVICE

CROSS-REFERENCE TO RELATED APPLICATIONS

This application claims priority to Japanese Patent Application No. 2018-202910 filed on Oct. 29, 2018, and Japanese Patent Application No. 2018-026032 filed on Feb. 16, 2018, which are incorporated herein by reference in its entirety including the specification, drawings and abstract.

BACKGROUND

1. Technical Field

A technique disclosed in the present specification relates to a semiconductor device.

2. Description of Related Art

A semiconductor device is described in Japanese Unexamined Patent Application Publication No. 2016-36047 (JP 2016-36047 A). The semiconductor device includes: a first semiconductor element; a second semiconductor element laminated to the first semiconductor element; a sealing body configured to seal the first semiconductor element and the second semiconductor element; a plurality of first signal terminals connected to signal electrodes of the first semiconductor element; and a plurality of second signal terminals connected to signal electrodes of the second semiconductor element. The first signal terminals and the second signal terminals project from the sealing body toward a first direction and are distanced from each other in terms of a second direction that is perpendicular to the first direction.

SUMMARY

In the above semiconductor device, the signal electrodes of the first semiconductor element and the second semiconductor element provided in a laminated manner are close to each other. Particularly, in terms of the second direction where the first signal terminals and the second signal terminals are arranged, the signal electrodes of the first semiconductor element and the signal electrodes of the second semiconductor element are placed at the same position. On this account, it is necessary to place, within a relatively narrow range, bonding wires for connecting the first signal terminals to the signal electrodes of the first semiconductor elements and bonding wires for connecting the second signal terminals to the signal electrodes of the second semiconductor element, and this can be a large restriction on the manufacturing of the semiconductor device.

A semiconductor device according to a first aspect of the disclosure includes: a first semiconductor element including a first signal electrode; a second semiconductor element including a second signal electrode, the second semiconductor element being laminated to the first semiconductor element; a sealing body configured to seal the first semiconductor element and the second semiconductor element; a first signal terminal connected to the first signal electrode; and a second signal terminal connected to the second signal electrode, wherein: the first signal terminal and the second signal terminal project from the sealing body and extend in a first direction; the first signal terminal and the second signal terminal are distanced from each other in a second direction, the second direction being a direction perpendicular to the first direction and a laminating direction of the first semiconductor element and the second semiconductor element; the first signal electrode and the second signal electrode are placed at different positions in the second direction; the first signal electrode is provided closer to the first signal terminal than to the second signal terminal; and the second signal electrode is provided closer to the second signal terminal than to the first signal terminal.

In the above aspect, the signal electrode of the first semiconductor element and the signal electrode of the second semiconductor element are placed at different positions in terms of the second direction where the first signal terminal and the second signal terminal are arranged. Hereby, the signal electrode of the first semiconductor element is placed so as to be close to the first signal terminal and the signal electrode of the second semiconductor element is placed so as to be close to the second signal terminal. In the above aspect, a circuit configuration in which the first signal terminal is connected to the signal electrode of the first semiconductor element and a circuit configuration in which the second signal terminal is connected to the signal electrode of the second semiconductor element are placed so as to be relatively distanced from each other, thereby making it possible to easily manufacture the semiconductor device, for example. Note that the first signal terminal may be connected to the signal electrode of the first semiconductor element via a bonding wire or other connection members, or the first signal terminal may be directly connected to the signal electrode of the first semiconductor element. This also applies to the connection between the second signal terminal and the signal electrode of the second semiconductor element.

In the above aspect, the first semiconductor element and the second semiconductor element may have the same configuration. The second semiconductor element may be placed at an angle 90 degrees shifted from the first semiconductor element.

With the above configuration, the signal electrode of the first semiconductor element and the signal electrode of the second semiconductor element can be placed at different positions in terms of the second direction where the first signal terminal and the second signal terminal are arranged. Since semiconductor elements having the same configuration can be employed for the first semiconductor element and the second semiconductor element, it is possible to further easily manufacture the semiconductor device, for example.

In the above aspect, the first semiconductor element and the second semiconductor element may have the same configuration, and the second semiconductor element may be provided such that the second semiconductor is reversed back-to-front from the first semiconductor element.

With the above configuration, at least one signal electrode of a plurality of signal electrodes may be provided closer to one corner part than to the other corner parts among four corner parts of the first semiconductor element, the signal electrodes being included in the first signal electrode.

In the above aspect, at least one signal electrode of a plurality of signal electrodes included in the first signal electrode may be provided in the first semiconductor element so as to be closer to one corner part than to other corner parts among four corner parts of the first semiconductor element.

With the above configuration, when the second semiconductor element is rotated by 90 degrees or reversed back-to-front from the first semiconductor element, the signal electrode of the first semiconductor element and the signal electrode of the second semiconductor element can be sufficiently distanced from each other in the second direction (that is, a direction where the first signal terminal and the second signal terminal are arranged).

In the above aspect, the signal electrode provided closer to the one corner part than to the other corner parts may be provided symmetrically with respect to a bisector of the one corner part.

With the above configuration, when the second semiconductor element is rotated by 90 degrees or reversed back-to-front from the first semiconductor element, the signal electrode of the first semiconductor element and the signal electrode of the second semiconductor element are placed symmetrically.

In the above aspect, all the signal electrodes included in the first signal electrode may be provided closer to the one corner part than to the other corner parts among the four corner parts of the first semiconductor element.

With the above configuration when the second semiconductor element is rotated by 90 degrees or reversed back-to-front from the first semiconductor element, all the signal electrodes of the first semiconductor element and all the signal electrodes of the second semiconductor element are not placed at the same position in terms of the second direction.

In the above aspect, the first semiconductor element and the second semiconductor element may have the same configuration; a plurality of signal electrodes having the same function may be provided, in the first semiconductor element, symmetrically with respect to a center line of the first semiconductor element in the second direction; and a plurality of signal electrodes having the same function may be provided, in the second semiconductor element, symmetrically with respect to a center line of the second semiconductor element in the second direction.

With the above configuration, the signal electrodes of the first semiconductor element and the signal electrodes of the second semiconductor element can be placed at different positions in terms of the second direction where the first signal terminal and the second signal terminal are arranged.

In the above aspect, the first semiconductor element and the second semiconductor element may be placed at different positions in the second direction. That is, the first semiconductor element and the second semiconductor element may not necessarily be provided on the same position. The first signal terminal may be shifted from the second signal terminal by shifting the first semiconductor element from the second semiconductor element.

In the above aspect, the first signal terminal and the second signal terminal may be placed at the same position in the laminating direction.

With the above configuration, the sealing body can be easily molded, for example.

In the above aspect, the semiconductor device may further include a power terminal electrically connected to the first semiconductor element. The power terminal may be placed on the opposite side from the first signal terminal across the sealing body.

With the above configuration, at the time when the sealing body is molded in a manufacturing stage of the semiconductor device, for example, the first semiconductor element and the second semiconductor element can be supported stably by the first signal terminal and the second signal terminal, and the power terminal placed on the opposite side from the first signal terminal and the second signal terminal.

In the above aspect, the first semiconductor element and the second semiconductor element may have the same configuration; the first semiconductor element may include a plurality of signal electrodes arranged in line; the second semiconductor element may include a plurality of signal electrodes arranged in line; and at least either one of a first arrangement direction and a second arrangement direction may form an angle with respect to the second direction, the first arrangement direction being an arrangement direction of the signal electrodes in the first semiconductor element, and the second arrangement direction being an arrangement direction of the signal electrodes in the second semiconductor element.

In the above aspect, the first arrangement direction and the second arrangement direction may not be parallel to each other and form respective angles with respect to the second direction.

In the above aspect, each of the first arrangement direction and the second arrangement direction may form an angle of 45 degrees to the second direction.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Embodiment 1

A semiconductor device 10 of Embodiment 1 will be described with reference to the drawings. The semiconductor device 10 of the present embodiment is a power semiconductor device and can be used for a power converter circuit such as a converter or an inverter in an electrically-driven vehicle such as an electric vehicle, a hybrid vehicle, and a fuel-cell vehicle, for example. Note that the purpose of the semiconductor device 10 is not limited particularly. The semiconductor device 10 can be widely used for various devices and circuits.

Figure 1:
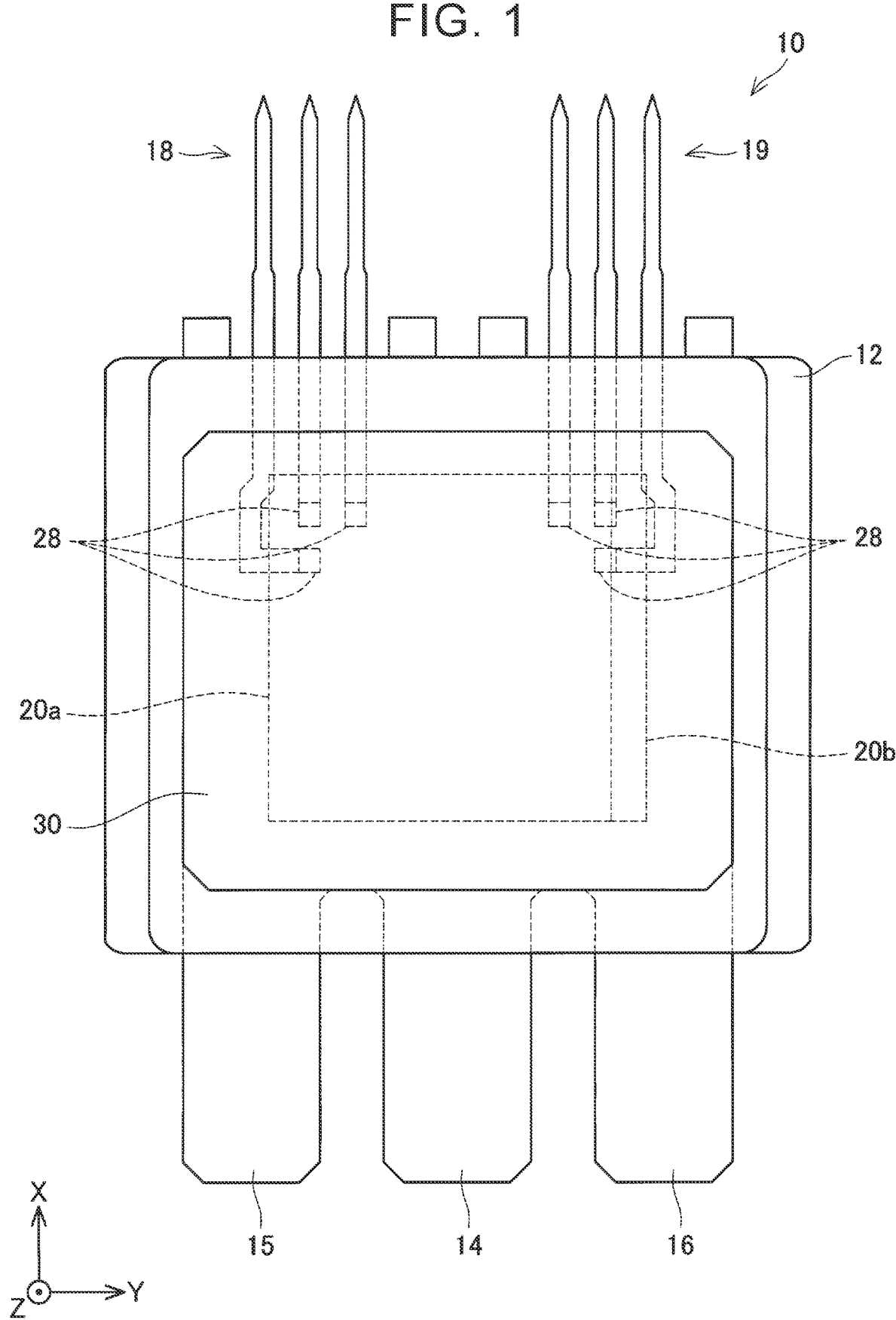
FIG. 1 illustrates a plan view of a semiconductor device 10 of Embodiment 1.
Figure 2:
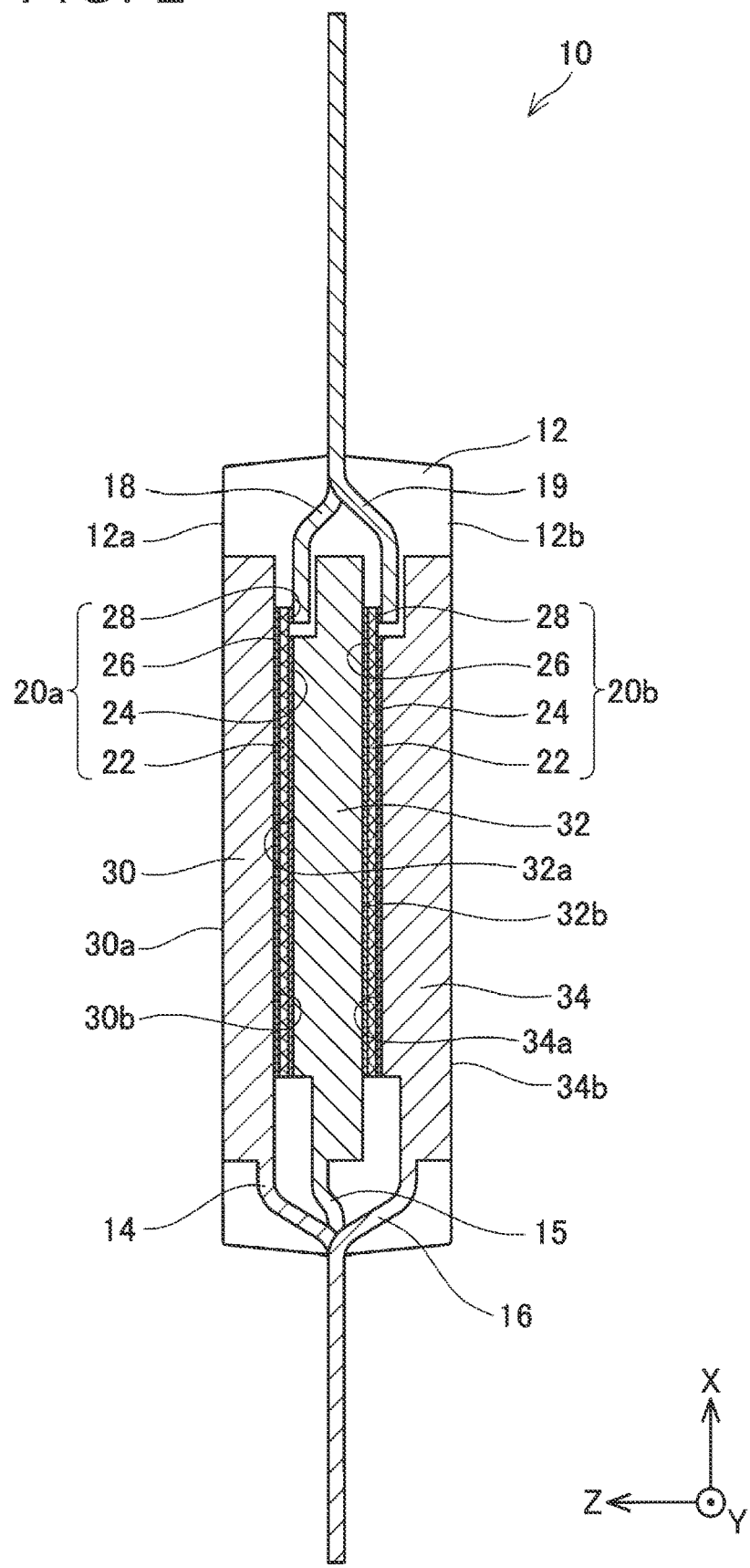
FIG. 2 schematically illustrates a sectional structure of the semiconductor device 10 of Embodiment 1.
Figure 3:
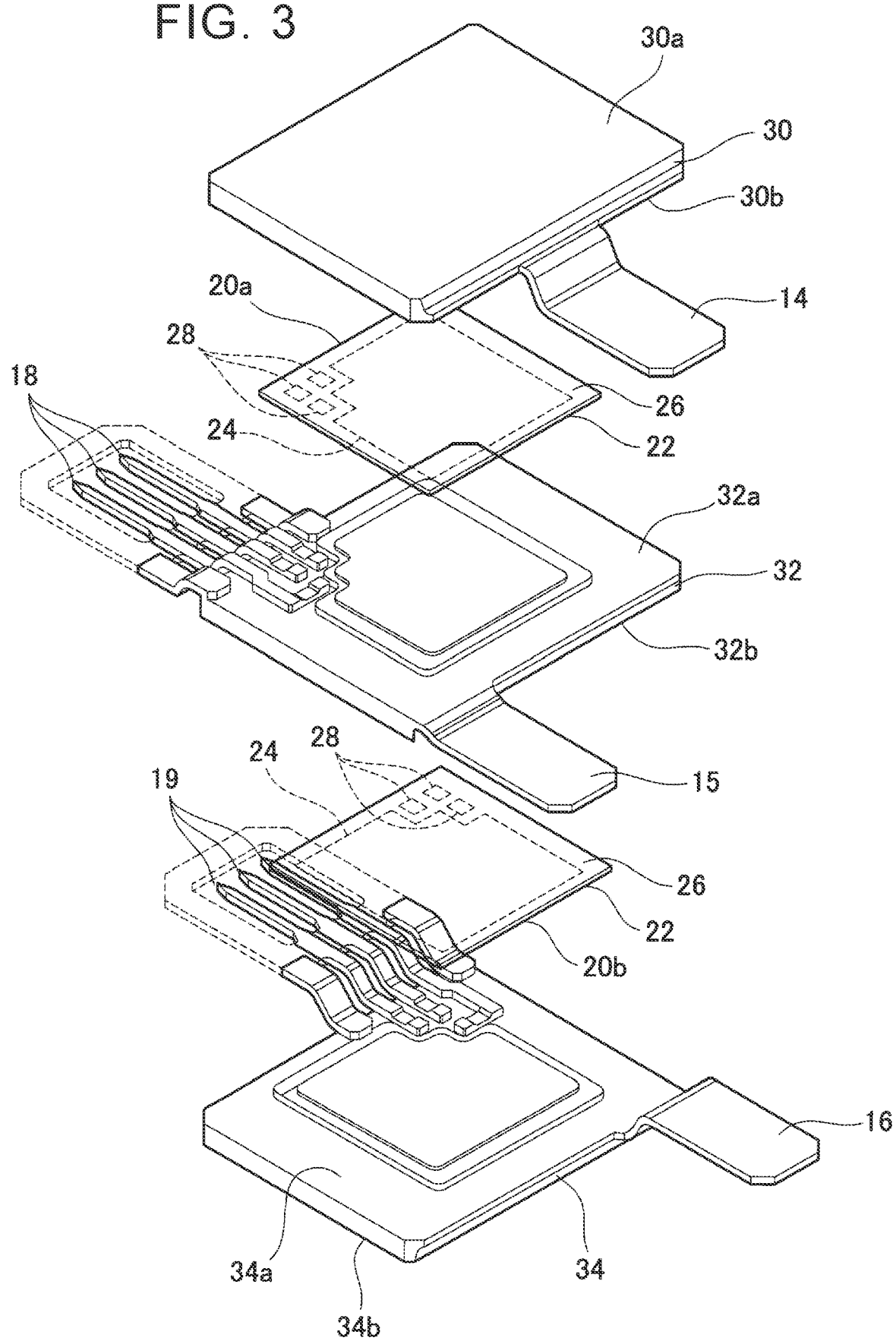
FIG. 3 illustrates an exploded view of the semiconductor device 10 of Embodiment 1.

As illustrated in FIGS. 1 to 3, the semiconductor device 10 includes a first semiconductor element 20a, a second semiconductor element 20b, a sealing body 12, and a plurality of terminals 14, 15, 16, 18, 19. The first semiconductor element 20a and the second semiconductor element 20b are provided in a laminated manner and sealed inside the sealing body 12. The first semiconductor element 20a and the second semiconductor element 20b are semiconductor elements having the same configuration. The second semiconductor element 20b is placed at an angle 90 degrees shifted from the first semiconductor element 20a. The sealing body 12 is made of a material having an insulating property and may be made of thermosetting resin such as epoxy resin, for example, but the sealing body 12 is not limited in particular. Each of the terminals 14, 15, 16, 18, 19 extends inwardly from outside the sealing body 12 so as to be electrically connected to at least either one of the first semiconductor element 20a and the second semiconductor element 20b inside the sealing body 12. The terminals 14, 15, 16, 18, 19 can be made of a conductive material such as metal, and the terminals 14, 15, 16, 18, 19 are made of copper in the present embodiment, although the terminals 14, 15, 16, 18, 19 are not limited in particular.

The terminals 14, 15, 16, 18, 19 include an upper power terminal 14 for electric power, a lower power terminal 16 for electric power, an intermediate power terminal 15 for electric power, a plurality of first signal terminals 18 for signal, and a plurality of second signal terminals 19 for signal. When the first signal terminals 18 and the second signal terminals 19 are planarly viewed along a laminating direction (a Z-direction in the figure) of the first semiconductor element 20a and the second semiconductor element 20b, the first signal terminals 18 and the second signal terminals 19 project from the sealing body 12 toward a first direction (an X-direction in the figure) and are distanced from each other in a second direction (a Y-direction in the figure) that is perpendicular to the first direction (the X-direction). The first signal terminals 18 extend generally in parallel to each other along the first direction (the X-direction) and are arranged at regular intervals along the second direction (the Y-direction). Similarly, the second signal terminals 19 extend generally in parallel to each other along the first direction (the X-direction) and are arranged at regular intervals along the second direction (the Y-direction). Note that "generally parallel" as used in the present specification indicates that an angle deviation of 10 degrees or less from an exact parallel state is allowable. Although the first signal terminals 18 and the second signal terminals 19 are not limited in particular, the first signal terminals 18 and the second signal terminals 19 are placed on the same plane at least at a position where the first signal terminals 18 and the second signal terminals 19 pass through a surface of the sealing body 12. Further, as indicated by a broken line in FIG. 3, in a manufacturing stage of the semiconductor device 10, the first signal terminals 18 may be fixed to (or formed integrally with) an intermediate conductor plate 32, as a lead frame. Similarly, the second signal terminals 19 may be fixed to (or formed integrally with) a lower conductor plate 34, as a lead frame.

The upper power terminal 14, the lower power terminal 16, and the intermediate power terminal 15 are placed on the opposite side from the first signal terminals 18 and the second signal terminals 19 across the sealing body 12. When the upper power terminal 14, the lower power terminal 16, and the intermediate power terminal 15 are planarly viewed along the laminating direction (the Z-direction), the upper power terminal 14, the lower power terminal 16, and the intermediate power terminal 15 project from the sealing body 12 toward the opposite direction from the first direction (the X-direction) and are distanced from each other in the second direction (the Y-direction in the figure). Since the upper power terminal 14, the lower power terminal 16, and the intermediate power terminal 15 are terminals where a relatively large current flows, the upper power terminal 14, the lower power terminal 16, and the intermediate power terminal 15 are formed wider than the first signal terminals 18 and the second signal terminals 19 and have a larger sectional area than those of the first signal terminals 18 and the second signal terminals 19. Although the upper power terminal 14, the lower power terminal 16, and the intermediate power terminal 15 are not limited in particular, the upper power terminal 14, the lower power terminal 16, and the intermediate power terminal 15 are placed on the same plane at least at a position where the upper power terminal 14, the lower power terminal 16, and the intermediate power terminal 15 pass the surface of the sealing body 12.

Figure 4:
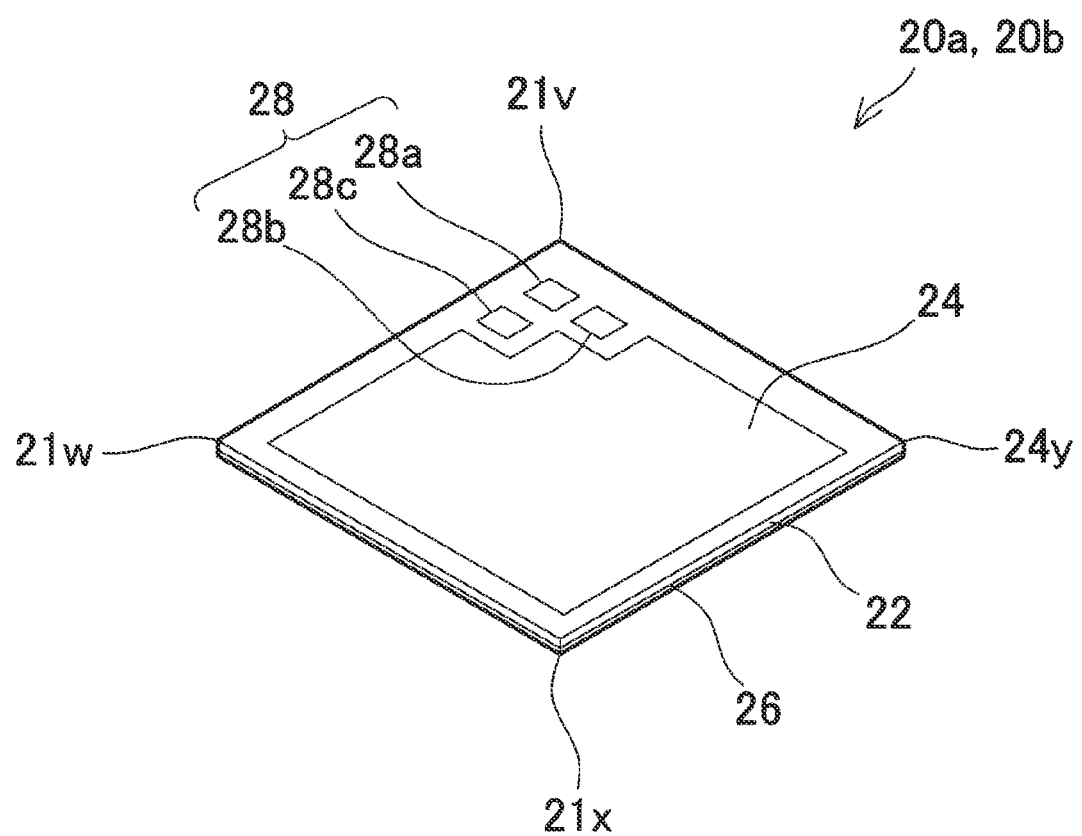
FIG. 4 illustrates semiconductor elements 20a, 20b in the semiconductor device 10 of Embodiment 1.

The first semiconductor element 20a and the second semiconductor element 20b are power semiconductor elements and have the same configuration. As illustrated in FIG. 4, each of the semiconductor elements 20a and 20b includes a semiconductor substrate 22, a front-surface electrode 24, a back-surface electrode 26, and a plurality of signal electrodes 28. The front-surface electrode 24 is provided on a front surface of the semiconductor substrate 22, and the back-surface electrode 26 is provided on a back surface of the semiconductor substrate 22. That is, the semiconductor element 20a, 20b is a vertical semiconductor element including the electrodes 24, 26 provided in a pair across the semiconductor substrate 22. The semiconductor element 20a, 20b has a generally rectangular plate shape and has four corner parts 21v, 21w, 21x, 21y.

The signal electrodes 28 are placed on a front surface side of the semiconductor substrate 22, similarly to the front-surface electrode 24. The signal electrodes 28 are provided in a close manner at one corner part 21v in the semiconductor element 20a, 20b. In the present embodiment, the signal electrodes 28 are provided symmetrically across a bisector of the one corner part 21v, although the signal electrodes 28 are not limited in particular. Further, all the signal electrodes 28 are placed so as to be closest to the one corner part 21v from among the four corner parts 21v, 21w, 21x, 21y in the semiconductor element 20a, 20b. That is, the signal electrodes 28 are all provided within a range of one fourth of the semiconductor element 20a, 20b.

As an example, the semiconductor element 20a, 20b in the present embodiment is a reverse conducting-insulated gate bipolar transistor (RC-IGBT), and the semiconductor substrate 22 is made of silicon (Si). In the semiconductor element 20a, 20b, the front-surface electrode 24 functions as an emitter electrode, and the back-surface electrode 26 functions as a collector electrode. Further, the signal electrodes 28 include, for example, a gate signal electrode 28a, a sense emitter electrode 28b, and a kelvin emitter electrode 28c. Note that the number of signal electrodes 28 and their functions are not limited to those exemplified in the present embodiment. As another example, the semiconductor element 20a, 20b may be other types of power semiconductor elements such as a metal-oxide-semiconductor field-effect transistor (MOSFET). Further, a material for forming the semiconductor substrate 22 is not limited to silicon and may be other semiconductors such as silicon carbide (SiC) or nitride semiconductor, for example. Further, the semiconductor element 20a, 20b may be replaced with a combination of two or more semiconductor elements such as a combination of a diode and an IGBT (or MOSFET).

Respective first signal terminals 18 are connected to respective signal electrodes 28 of the first semiconductor element 20a inside the sealing body 12. As an example, in the present embodiment, the first signal terminals 18 are directly soldered to the signal electrodes 28. Note that, as another example, the first signal terminals 18 may be connected to the signal electrodes 28 by wire bonding, for example. How to connect to the first signal terminals 18 to the signal electrodes 28 is not limited in particular. Similarly, respective second signal terminals 19 are connected to respective signal electrodes 28 of the second semiconductor element 20b inside the sealing body 12. How to connect to the second signal terminals 19 to the signal electrodes 28 is also not limited in particular. Note that, as another example, one first signal terminal 18 or second signal terminal 19 may be connected to two or more signal electrodes 28 of the first semiconductor element 20a and/or the second semiconductor element 20b. Alternatively, two or more first signal terminals 18 and/or second signal terminals 19 may be connected to one signal electrode 28 of the first semiconductor element 20a or the second semiconductor element 20b.

Referring back to FIGS. 1 to 3, the semiconductor device 10 includes an upper conductor plate 30, the intermediate conductor plate 32, and the lower conductor plate 34. The upper conductor plate 30 is a generally plate-shaped member and includes a top face 30a and a bottom face 30b. The back-surface electrode 26 of the first semiconductor element 20a is joined to the bottom face 30b of the upper conductor plate 30. The upper power terminal 14 is connected to the upper conductor plate 30. Hereby, the back-surface electrode 26 of the first semiconductor element 20a is electrically connected to the upper power terminal 14 via the upper conductor plate 30. As an example, in the present embodiment, the upper power terminal 14 is provided integrally with the upper conductor plate 30. The top face 30a of the upper conductor plate 30 is exposed on a top face 12a of the sealing body 12. Hereby, the upper conductor plate 30 also functions as a heat sink that releases heat of the two semiconductor elements 20a, 20b to outside.

The intermediate conductor plate 32 is a generally plate-shaped member and includes a top face 32a and a bottom face 32b. The intermediate conductor plate 32 is placed between the first semiconductor element 20a and the second semiconductor element 20b and faces the bottom face 30b of the upper conductor plate 30 across the first semiconductor element 20a. The front-surface electrode 24 of the first semiconductor element 20a is joined to the top face 32a of the intermediate conductor plate 32. Further, the back-surface electrode 26 of the second semiconductor element 20b is joined to the bottom face 32b of the intermediate conductor plate 32. Hereby, the two semiconductor elements 20a, 20b are serially-connected to each other via the intermediate conductor plate 32. The intermediate power terminal 15 is connected to the intermediate conductor plate 32. As an example, in the present embodiment, the intermediate power terminal 15 is provided integrally with the intermediate conductor plate 32.

The lower conductor plate 34 is a generally plate-shaped member and includes a top face 34a and a bottom face 34b. The lower conductor plate 34 faces the bottom face 32b of the intermediate conductor plate 32 across the second semiconductor element 20b. The front-surface electrode 24 of the second semiconductor element 20b is joined to the top face 34a of the lower conductor plate 34. The lower power terminal 16 is connected to the lower conductor plate 34. Hereby, the front-surface electrode 24 of the second semiconductor element 20b is electrically connected to the lower power terminal 16 via the lower conductor plate 34. As an example, in the present embodiment, the lower power terminal 16 is provided integrally with the lower conductor plate 34. The bottom face 34b of the lower conductor plate 34 is exposed on a bottom face 12b of the sealing body 12. Hereby, the lower conductor plate 34 also functions as a heat sink that releases heat of the two semiconductor elements 20a, 20b to outside.

With such a configuration, the semiconductor device 10 of the present embodiment has a circuit structure in which two RC-IGBTs are serially-connected between the upper power terminal 14 and the lower power terminal 16 and the intermediate power terminal 15 is connected between the two RC-IGBTs. Accordingly, the semiconductor device 10 can constitute upper and lower arms in a power converter circuit such as a DC-DC converter or an inverter, for example. Note that a plurality of first semiconductor elements 20a may be provided in parallel between the upper conductor plate 30 and the intermediate conductor plate 32, and a plurality of second semiconductor elements 20b may be provided in parallel between the intermediate conductor plate 32 and the lower conductor plate 34. Hereby, a rated current (allowable current) of the semiconductor device 10 can be raised, for example.

Figure 5:
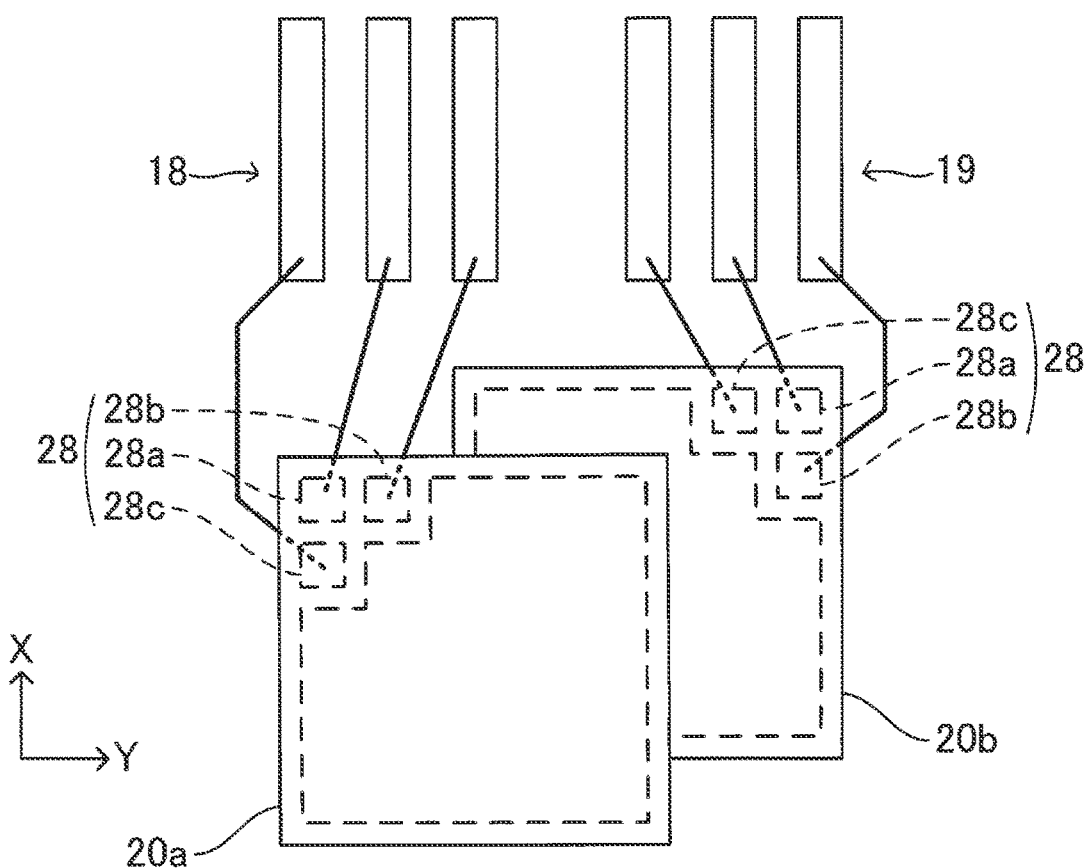
FIG. 5 schematically illustrates a main feature of the semiconductor device 10 of Embodiment 1.

In the semiconductor device 10 of the present embodiment, as schematically illustrated in FIG. 5, the second semiconductor element 20b is placed with a posture rotated by 90 degrees from the first semiconductor element 20a. Hereby, in terms of the second direction (the Y-direction) where the first signal terminals 18 and the second signal terminals 19 are arranged, the signal electrodes 28 of the first semiconductor element 20a and the signal electrodes 28 of the second semiconductor element 20b are placed at different positions. As a result, the signal electrodes 28 of the first semiconductor element 20a are placed so as to be close to the first signal terminals 18 and the signal electrodes 28 of the second semiconductor element 20b are placed so as to be close to the second signal terminals 19. In such a configuration, a circuit configuration in which the first signal terminals 18 are connected to the signal electrodes 28 of the first semiconductor element 20a and a circuit configuration in which the second signal terminals 19 are connected to the signal electrodes 28 of the second semiconductor element 20b are placed so as to be relatively distanced from each other, thereby making it possible to easily manufacture the semiconductor device 10, for example. Note that the first signal terminals 18 may be connected to the signal electrodes 28 of the first semiconductor element 20a via bonding wires or other connection members (e.g., a circuit substrate). Alternatively, like the present embodiment, the first signal terminals 18 may be directly connected to the signal electrodes 28 of the first semiconductor element 20a. This also applies to the connection between the second signal terminals 19 and the signal electrodes 28 of the second semiconductor element 20b.

In the semiconductor device 10 of the present embodiment, semiconductor elements having the same configuration are employed for the first semiconductor element 20a and the second semiconductor element 20b. As described above, in the semiconductor element 20a, 20b, the signal electrodes 28 are provided symmetrically across the bisector of the one corner part 21v (see FIG. 4). In such a configuration, when the second semiconductor element 20b is located at an angle of 90 degrees shifted from the first semiconductor element 20a, the signal electrodes 28 of the first semiconductor element 20a and the signal electrodes 28 of the second semiconductor element 20b are placed symmetrically. Hereby, by constituting the first signal terminals 18 and the second signal terminals 19 symmetrically, for example, the first signal terminals 18 and the second signal terminals. 19 can have the same electrical specification or similar electrical specifications to each other.

Further, in the semiconductor element 20a, 20b of the present embodiment, the signal electrodes 28 are all placed so as to be closest to the one corner part 21v from among the four corner parts 21v, 21w, 21x, 21y of the semiconductor element 20a, 20b (see FIG. 4). In such a configuration, when the second semiconductor element 20b is rotated by 90 degrees from the first semiconductor element 20a, all the signal electrodes 28 of the first semiconductor element 20a and all the signal electrodes 28 of the second semiconductor element 20b are not placed at the same position in the second direction (the Y-direction). Note that, in the present embodiment, in terms of the second direction (the Y-direction), the first semiconductor element 20a and the second semiconductor element 20b are placed at different positions. With such a configuration, a distance between the signal electrodes 28 of the first semiconductor element 20a and the signal electrodes 28 of the second semiconductor element 20b can be made larger.

As another example, the first semiconductor element 20a and the second semiconductor element 20b may be placed at the same position in terms of the second direction (the Y-direction). Further, in terms of the first direction (the X-direction), the first semiconductor element 20a and the second semiconductor element 20b may be placed at the same position or may be placed at different positions. However, in order to avoid upsizing of the semiconductor device 10, in some embodiments, respective areas of the two semiconductor elements 20a, 20b overlap with each other by 50% or more, 75% or more, or 90% or more when the semiconductor elements 20a, 20b are planarly viewed along the laminating direction (the Z-direction) of the semiconductor elements 20a, 20b.

In the semiconductor device 10 of the present embodiment, the first signal terminals 18 and the second signal terminals 19 are placed on a first side of the sealing body 12, and three power terminals 14, 15, 16 are placed on a second side of the sealing body 12. With such a configuration, at the time when the sealing body 12 is molded in a manufacturing stage of the semiconductor device 10, for example, the first semiconductor element 20a and the second semiconductor element 20b can be supported stably by the first signal terminals 18 and the second signal terminals 19, and the power terminals 14, 15, 16 placed on the opposite side from the first signal terminals 18 and the second signal terminals 19.

Figure 6A:
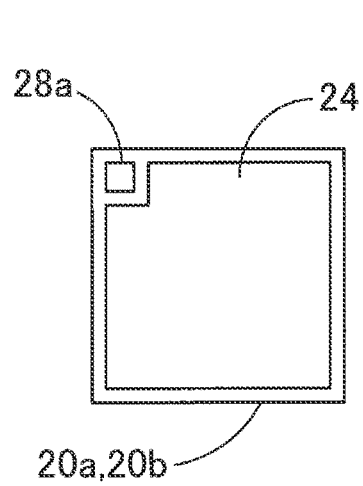
FIG. 6A illustrates a first example of modifications of the semiconductor elements 20a and 20b.
Figure 6B:
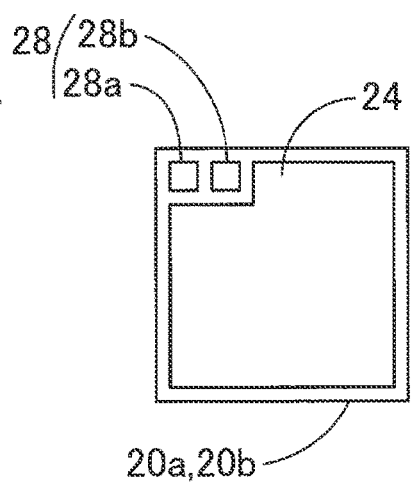
FIG. 6B illustrates a second example of modifications of the semiconductor elements 20a and 20b.
Figure 6C:
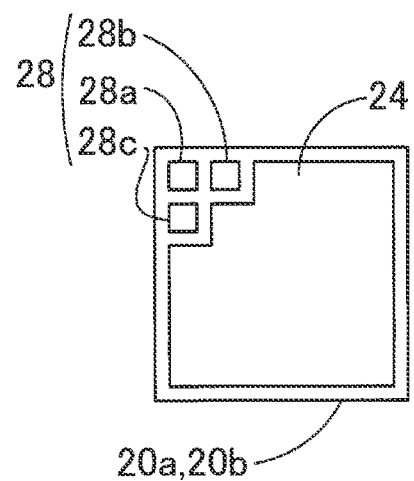
FIG. 6C illustrates a third example of modifications of the semiconductor elements 20a and 20b.

The number and position of signal electrodes 28 included in the first semiconductor element 20a and the second semiconductor element 20b and the function of the signal electrodes 28 are not limited in particular. For example, as illustrated in FIG. 6A, the first semiconductor element 20a and/or the second semiconductor element 20b may include only one signal electrode 28a. Alternatively, as illustrated in FIG. 6B, the first semiconductor element 20a and/or the second semiconductor element 20b may include two signal electrodes 28a, 28b. Alternatively, as illustrated in FIG. 6C, the first semiconductor element 20a and/or the second semiconductor element 20b may include three signal electrodes 28a, 28b, 28c (or more).

Embodiment 2

Figure 7:
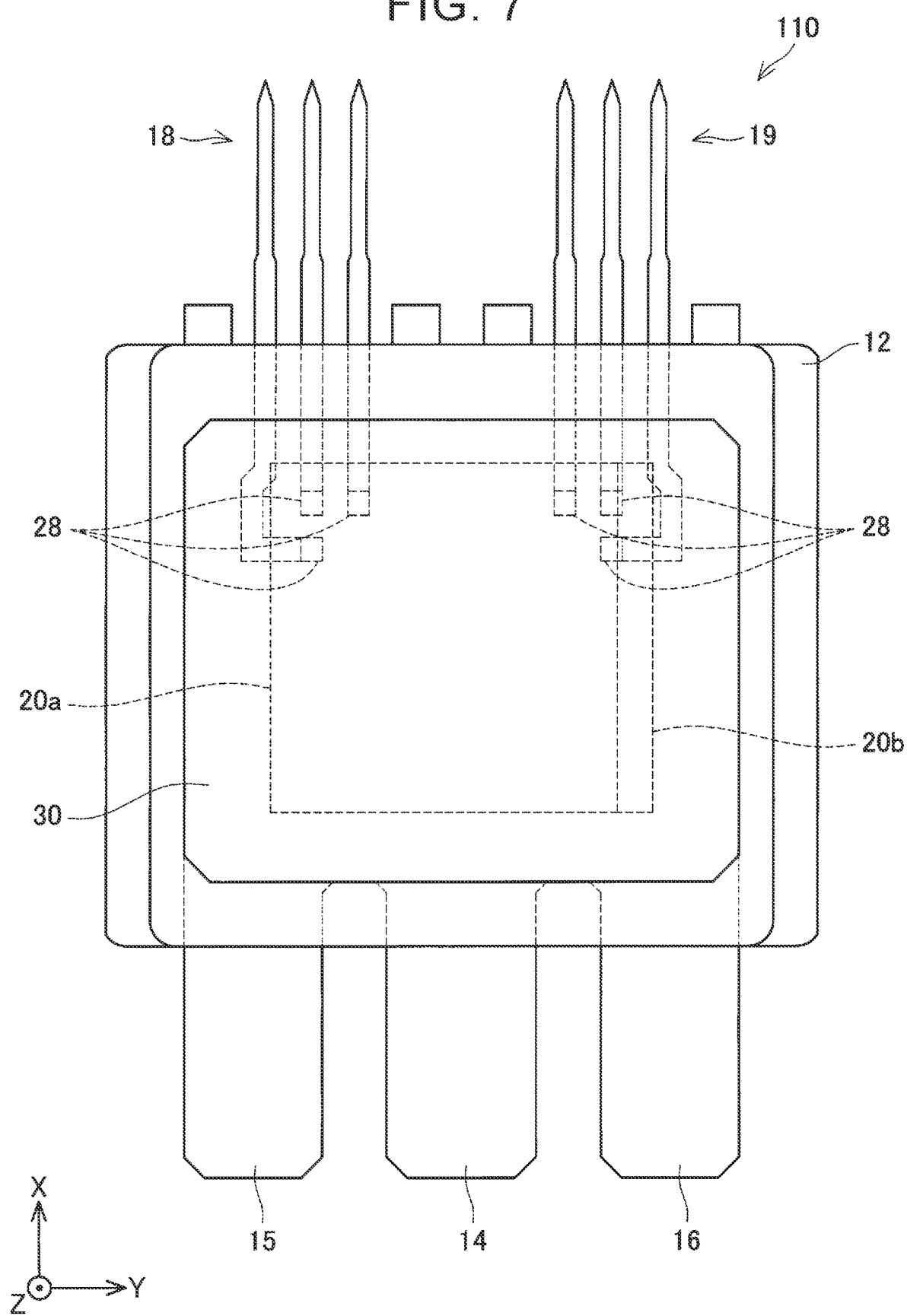
FIG. 7 illustrates a plan view of a semiconductor device 110 of Embodiment 2.
Figure 8:
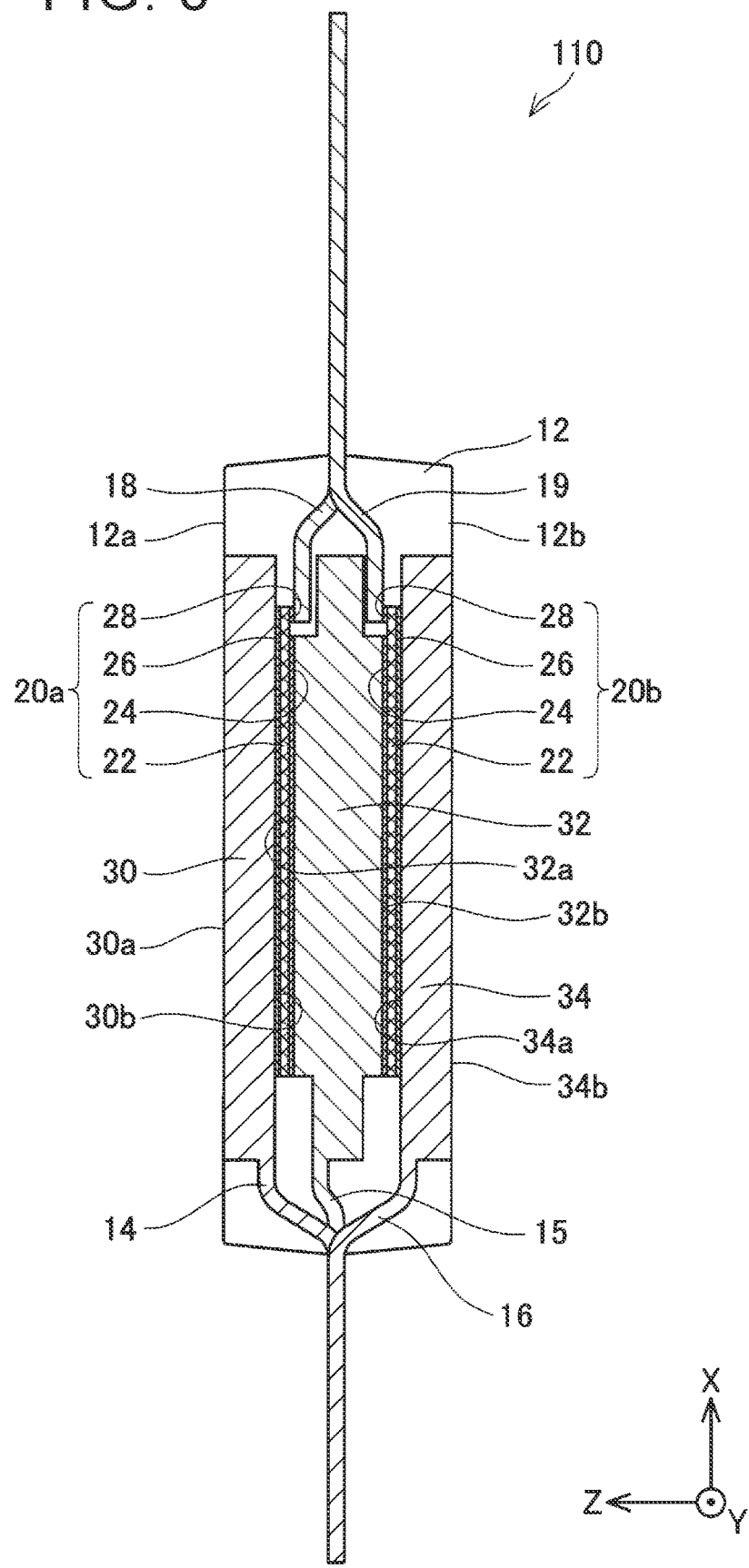
FIG. 8 schematically illustrates a sectional structure of the semiconductor device 110 of Embodiment 2.
Figure 9:
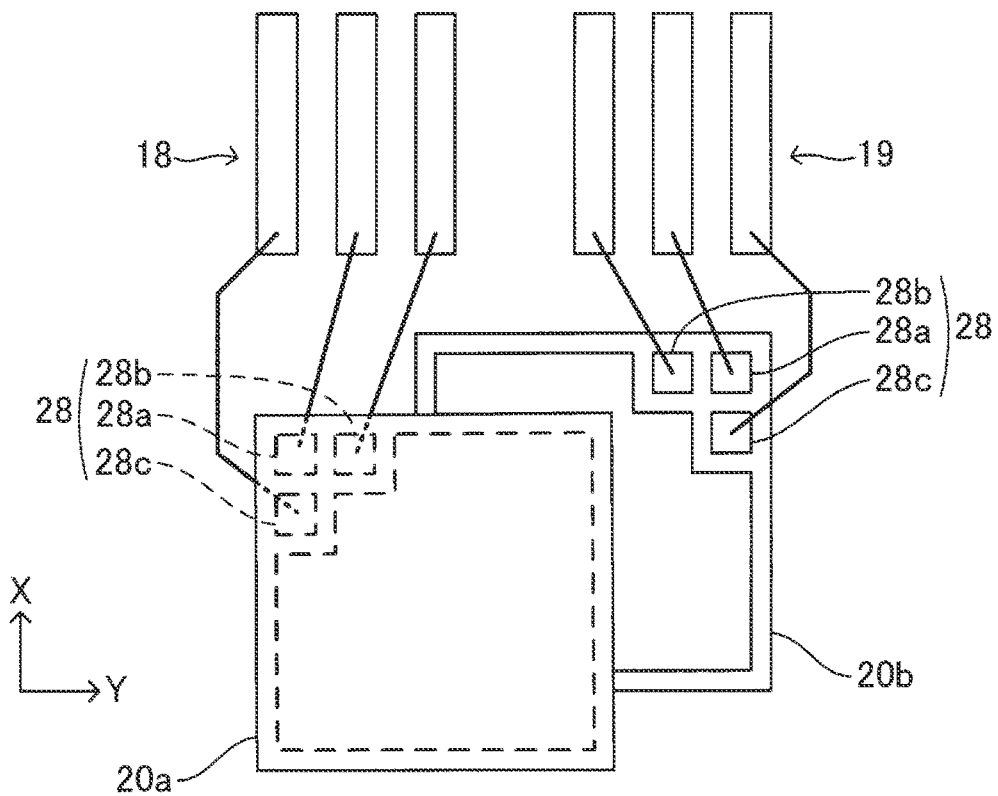
FIG. 9 schematically illustrates a main feature of the semiconductor device 110 of Embodiment 2.

With reference to FIGS. 7 to 9, the following describes a semiconductor device 110 of Embodiment 2. The semiconductor device 110 of the present embodiment is different from the semiconductor device 10 of Embodiment 1 in that the posture of the second semiconductor element 20b is changed. More specifically, the second semiconductor element 20b is placed so as to be reversed from the first semiconductor element 20a, and this point is a difference from the semiconductor device 10 of Embodiment 1. Other points of the semiconductor device 110 of Embodiment 2 are the same as those of the semiconductor device 10 of Embodiment 1. Accordingly, the same reference sign is assigned to the same constituent and a redundant description is omitted. Further, the modifications described in Embodiment 1 can be also employed in the present embodiment.

The posture of the first semiconductor element 20a is not changed from that in the semiconductor device 10 of Embodiment 1. Accordingly, the back-surface electrode 26 of the first semiconductor element 20a is joined to the bottom face 30b of the upper conductor plate 30, and the front-surface electrode 24 of the first semiconductor element 20a is joined to the top face 32a of the intermediate conductor plate 32. On the other hand, the posture of the second semiconductor element 20b is reversed from that in the semiconductor device 10 of Embodiment 1. Accordingly, the front-surface electrode 24 of the second semiconductor element 20b is joined to the bottom face 32b of the intermediate conductor plate 32, and the back-surface electrode 26 of the second semiconductor element 20b is joined to the top face 34a of the lower conductor plate 34.

In the above configuration, the semiconductor device 110 of the present embodiment has a circuit structure in which two RC-IGBTs are serially-connected when the upper power terminal 14 and the lower power terminal 16 are connected to each other. Such a circuit structure can constitute an upper arm or a lower arm in a power converter circuit such as a DC-DC converter or an inverter, for example. Note that a plurality of first semiconductor elements 20a may be provided in parallel between the upper conductor plate 30 and the intermediate conductor plate 32, and a plurality of second semiconductor elements 20b may be provided in parallel between the intermediate conductor plate 32 and the lower conductor plate 34. Hereby, a rated current (allowable current) of the semiconductor device 110 can be raised, for example.

In the semiconductor device 110 of the present embodiment, as schematically illustrated in FIG. 9, the second semiconductor element 20b is placed such that the second semiconductor element 20b is reversed back-to-front from the first semiconductor element 20a. Hereby, in terms of the second direction (the Y-direction) where the first signal terminals 18 and the second signal terminals 19 are arranged, the signal electrodes 28 of the first semiconductor element 20a and the signal electrodes 28 of the second semiconductor element 20b are placed at different positions. As a result, the signal electrodes 28 of the first semiconductor element 20a are placed so as to be close to the first signal terminals 18 and the signal electrodes 28 of the second semiconductor element 20b are placed so as to be close to the second signal terminals 19. In such a configuration, a circuit configuration in which the first signal terminals 18 are connected to the signal electrodes 28 of the first semiconductor element 20a and a circuit configuration in which the second signal terminals 19 are connected to the signal electrodes 28 of the second semiconductor element 20b are placed so as to be relatively distanced from each other, thereby making it possible to easily manufacture the semiconductor device 110, for example. Note that the first signal terminals 18 may be connected to the signal electrodes 28 of the first semiconductor element 20a via bonding wires or other connection members (e.g., a circuit substrate). Alternatively, like the present embodiment, the first signal terminals 18 may be directly connected to the signal electrodes 28 of the first semiconductor element 20a. This also applies to the connection between the second signal terminals 19 and the signal electrodes 28 of the second semiconductor element 20b.

In the semiconductor device 110 of the present embodiment, semiconductor elements having the same configuration are employed for the first semiconductor element 20a and the second semiconductor element 20b. As described in Embodiment 1, in the semiconductor element 20a, 20b, the signal electrodes 28 are provided symmetrically across the bisector of the one corner part 21v (see FIG. 4). In such a configuration, when the second semiconductor element 20b is reversed back-to-front from the first semiconductor element 20a, the signal electrodes 28 of the first semiconductor element 20a and the signal electrodes 28 of the second semiconductor element 20b are placed symmetrically. Hereby, by constituting the first signal terminals 18 and the second signal terminals 19 symmetrically, for example, the first signal terminals 18 and the second signal terminals 19 can have the same electrical specification or similar electrical specifications to each other.

Further, in the semiconductor element 20a, 20b of the present embodiment, the signal electrodes 28 are all placed so as to be closest to the one corner part 21v from among the four corner parts 21v, 21w, 21x, 21y of the semiconductor element 20a, 20b (see FIG. 4). In such a configuration, when the second semiconductor element 20b is reversed back-to-front from the first semiconductor element 20a, all the signal electrodes 28 of the first semiconductor element 20a and all the signal electrodes 28 of the second semiconductor element 20b are not placed at the same position in the second direction (the Y-direction). Note that, in the present embodiment, in terms of the second direction (the Y-direction), the first semiconductor element 20a and the second semiconductor element 20b are placed at different positions. With such a configuration, a distance between the signal electrodes 28 of the first semiconductor element 20a and the signal electrodes 28 of the second semiconductor element 20b can be made larger.

Figure 10:
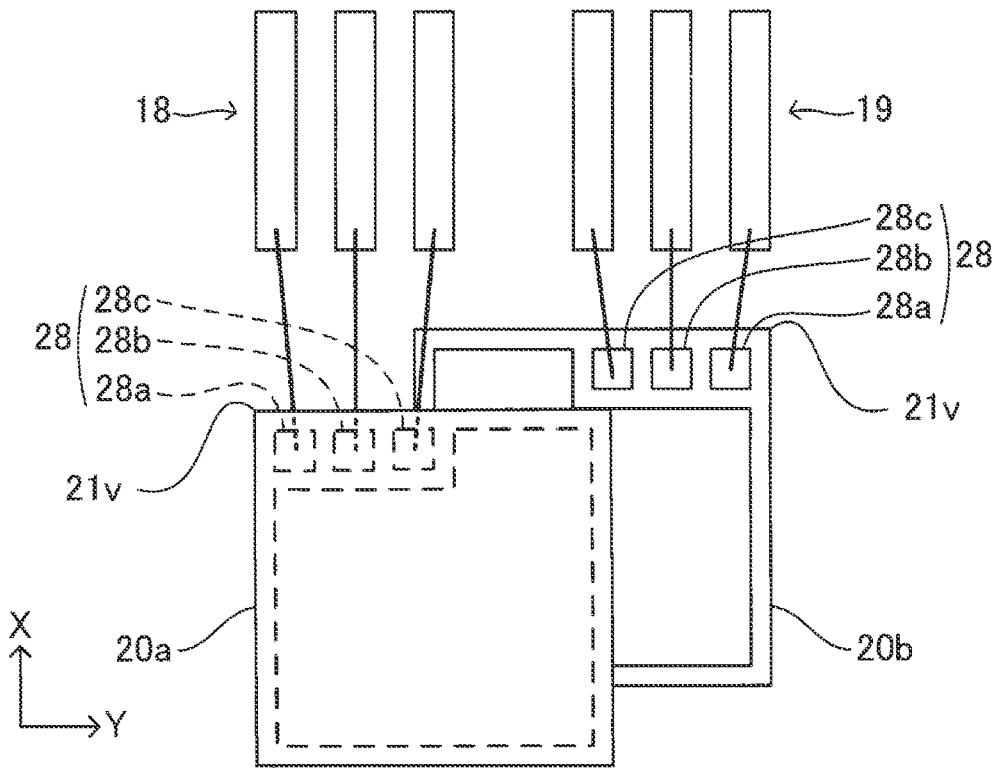
FIG. 10 schematically illustrates a main feature of a modification of the semiconductor device 110 of Embodiment 2.

In the semiconductor element 20a, 20b, the number and placement of signal electrodes 28 may be changed variously. That is, the semiconductor device 110 of the present embodiment also can employ various semiconductor elements 20a, 20b as illustrated in FIGS. 6A to 6C. Further, as illustrated in FIG. 10, as long as one or more signal electrodes 28 are provided in a close manner at the one corner part 21v in the semiconductor element 20a, 20b, the one or more signal electrodes 28 may not necessarily be provided symmetrically across the bisector of the corner part 21v. Even in this case, when the second semiconductor element 20b is placed with a posture reversed back-to-front from the first semiconductor element 20a, the signal electrodes 28 of the first semiconductor element 20a and the signal electrodes 28 of the second semiconductor element 20b are placed at different positions from each other in terms of the second direction (the Y-direction) where the first signal terminals 18 and the second signal terminals 19 are arranged.

In the present embodiment, the first semiconductor element 20a and the second semiconductor element 20b are placed so that the front-surface electrode 24 of the first semiconductor element 20a and the front-surface electrode 24 of the second semiconductor element 20b face each other. In other words, the first semiconductor element 20a and the second semiconductor element 20b are placed so that the back-surface electrode 26 of the first semiconductor element 20a and the back-surface electrode 26 of the second semiconductor element 20b face outwardly. This is because the area of the back-surface electrode 26 is larger than the area of the front-surface electrode 24, and the back-surface electrode 26 is superior to the front-surface electrode 24 in terms of a heat dissipation property. As described earlier, the upper conductor plate 30 and the lower conductor plate 34 function as a heat sink. From this point, when the back-surface electrodes 26 of the first semiconductor element 20a and the second semiconductor element 20b are each connected to a corresponding one of the upper conductor plate 30 and the lower conductor plate 34, heat of the first semiconductor element 20a and the second semiconductor element 20b can be released outside efficiently.

Note that, as another example, the first semiconductor element 20a and the second semiconductor element 20b may be placed so that the back-surface electrode 26 of the first semiconductor element 20a and the back-surface electrode 26 of the second semiconductor element 20b face each other. Further, since the intermediate conductor plate 32 does not function as a heat sink, the thickness of the intermediate conductor plate 32 may be reduced in comparison with the thicknesses of the upper conductor plate 30 and the lower conductor plate 34. This makes it possible to achieve downsizing of the semiconductor device 110. This also applies to the semiconductor device 10 of Embodiment 1.

Embodiment 3

Figure 11:
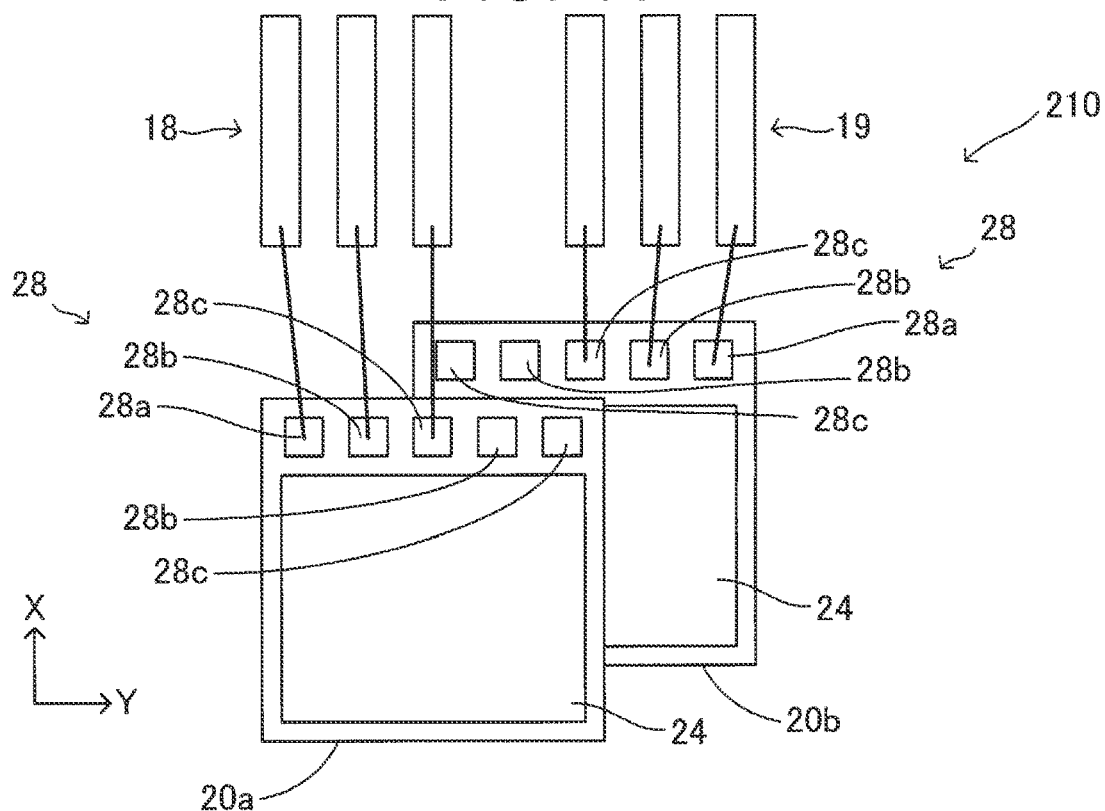
FIG. 11 schematically illustrates a main feature of a semiconductor device 210 of Embodiment 3.

With reference to FIG. 11, the following describes a semiconductor device 210 of Embodiment 3. The semiconductor device 210 of the present embodiment is different from the semiconductor device 10 of Embodiment 1 in that the configuration of the first semiconductor element 20a and the second semiconductor element 20b is changed. Note that, in the present embodiment, semiconductor elements having the same configuration are also employed for the first semiconductor element 20a and the second semiconductor element 20b. Note that the first semiconductor element 20a and the second semiconductor element 20b are not placed at an angle of 90 degrees shifted from each other and are, placed with the same posture.

In the first semiconductor element 20a and the second semiconductor element 20b of the present embodiment, the signal electrodes 28 are arranged along the second direction (the Y-direction) where the first signal terminals 18 and the second signal terminals 19 are arranged. The signal electrodes 28 include two gate signal electrodes 28a, two sense emitter electrodes 28b, and one kelvin emitter electrode 28c. The kelvin emitter electrode 28c is placed at the center of the semiconductor element 20a, 20b in terms of the Y-direction. The two gate signal electrodes 28a and the two sense emitter electrodes 28b are placed symmetrically across the kelvin emitter electrode 28c.

As described above, in each of the first semiconductor element 20a and the second semiconductor element 20b of the present embodiment, the signal electrodes 28a, 28b having the same function are placed bilaterally symmetrically. Even in such a configuration, three signal electrodes 28 connected to the first signal terminals 18, among the signal electrodes 28 of the first semiconductor element 20a, are placed so as to be close to the first signal terminals 18. Further, three signal electrodes 28 connected to the second signal terminals 19, among the signal electrodes 28 of the second semiconductor element 20b, are placed so as to be close to the second signal terminals 19. Accordingly, a circuit configuration in which the first signal terminals 18 are connected to the signal electrodes 28 of the first semiconductor element 20a and a circuit configuration in which the second signal terminals 19 are connected to the signal electrodes 28 of the second semiconductor element 20b are placed so as to be relatively distanced from each other, thereby making it possible to easily manufacture the semiconductor device 210, for example. Note that the first signal terminals 18 may be connected to the signal electrodes 28 of the first semiconductor element 20a via bonding wires or other connection members (e.g., a circuit substrate). Alternatively, the first signal terminals 18 may be directly connected to the signal electrodes 28 of the first semiconductor element 20a. This also applies to the connection between the second signal terminals 19 and the signal electrodes 28 of the second semiconductor element 20b.

Embodiment 4

Figure 12:
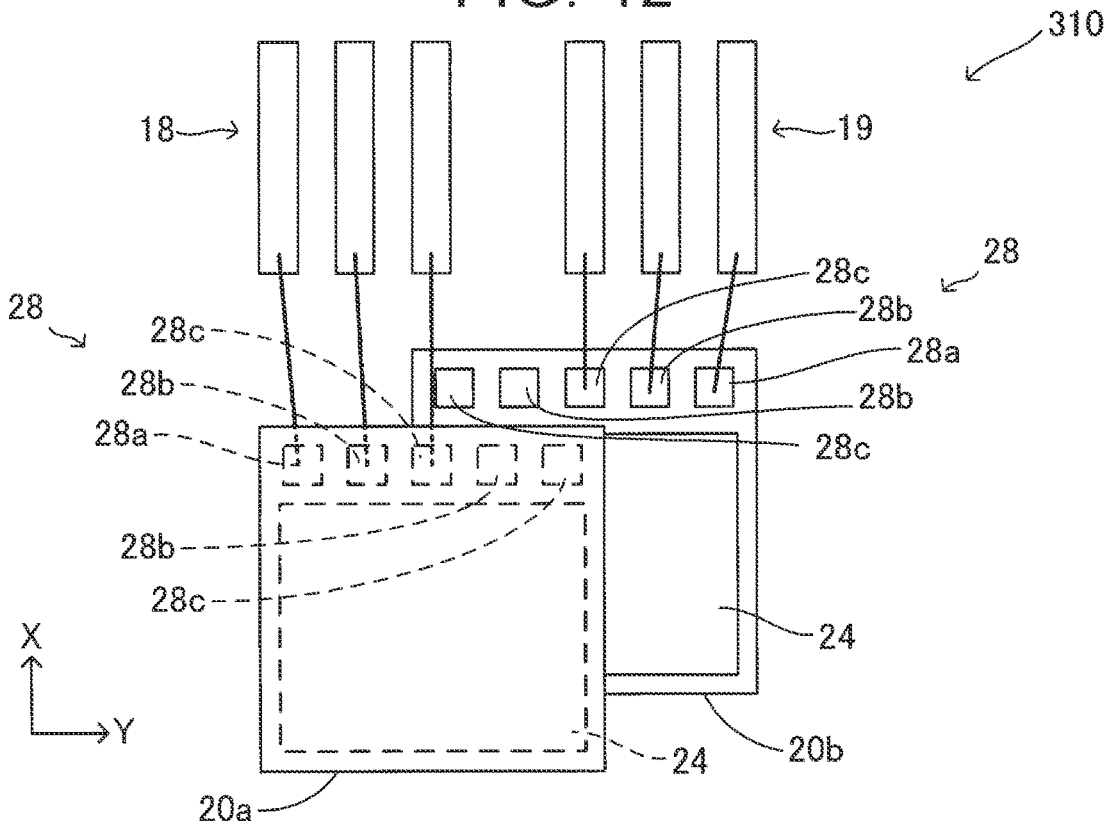
FIG. 12 schematically illustrates a main feature of a semiconductor device 310 of Embodiment 4.

With reference to FIG. 12, the following describes a semiconductor device 310 of Embodiment 4. The semiconductor device 310 of the present embodiment is different from the semiconductor device 110 of Embodiment 2 in that the configuration of the first semiconductor element 20a and the second semiconductor element 20b is changed. Note that, in the present embodiment, semiconductor elements having the same configuration are also employed for the first semiconductor element 20a and the second semiconductor element 20b. The second semiconductor element 20b is placed such that the second semiconductor element 20b is reversed back-to-front from the first semiconductor element 20a.

In the first semiconductor element 20a and the second semiconductor element 20b of the present embodiment, the signal electrodes 28 are arranged along the second direction (the Y-direction) where the first signal terminals 18 and the second signal terminals 19 are arranged. The signal electrodes 28 include two gate signal electrodes 28a, two sense emitter electrodes 28b, and one kelvin emitter electrode 28c. The kelvin emitter electrode 28c is placed at the center of the semiconductor element 20a, 20b in terms of the Y-direction. The two gate signal electrodes 28a and the two sense emitter electrodes 28b are placed symmetrically across the kelvin emitter electrode 28c. That is, the semiconductor device 310 of the present embodiment is configured such that the first semiconductor element 20a and the second semiconductor element 20b as described in Embodiment 3 are employed in the semiconductor device 110 of Embodiment 2.

As described above, in each of the first semiconductor element 20a and the second semiconductor element 20b of the present embodiment, the signal electrodes 28a, 28b having the same function are placed bilaterally symmetrically. Even in such a configuration, three signal electrodes 28 connected to the first signal terminals 18, among the signal electrodes 28 of the first semiconductor element 20a, are placed so as to be close to the first signal terminals 18. Further, three signal electrodes 28 connected to the second signal terminals 19, among the signal electrodes 28 of the second semiconductor element 20b, are placed so as to be close to the second signal terminals 19. Accordingly, a circuit configuration in which the first signal terminals 18 are connected to the signal electrodes 28 of the first semiconductor element 20a and a circuit configuration in which the second signal terminals 19 are connected to the signal electrodes 28 of the second semiconductor element 20b are placed so as to be relatively distanced from each other, thereby making it possible to easily manufacture the semiconductor device 310, for example. Note that the first signal terminals 18 may be connected to the signal electrodes 28 of the first semiconductor element 20a via bonding wires or other connection members (e.g., a circuit substrate). Alternatively, the first signal terminals 18 may be directly connected to the signal electrodes 28 of the first semiconductor element 20a. This also applies to the connection between the second signal terminals 19 and the signal electrodes 28 of the second semiconductor element 20b.

Figure 13A:
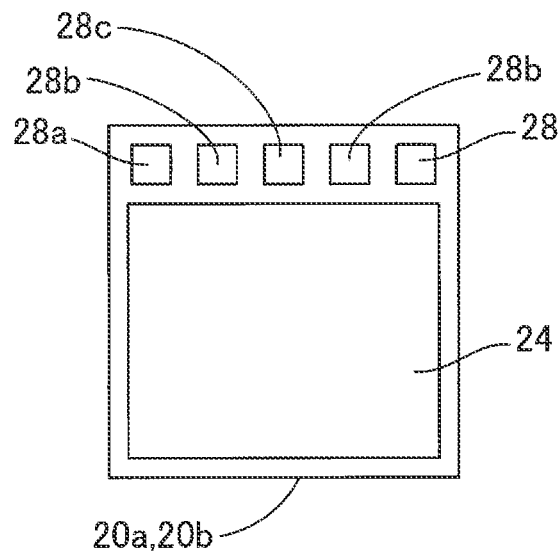
FIG. 13A illustrates a forth example of modifications of the semiconductor elements 20a and 20b.
Figure 13B:
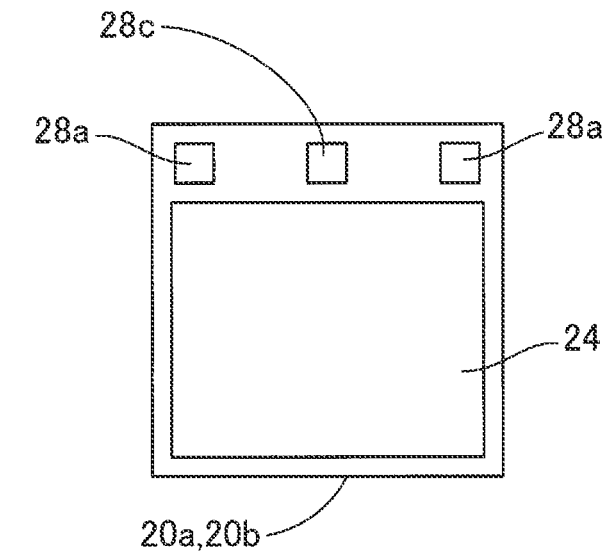
FIG. 13B illustrates a fifth example of modifications of the semiconductor elements 20a and 20b.
Figure 13C:
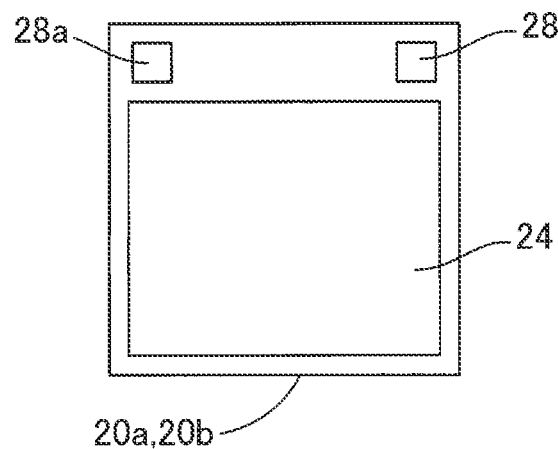
FIG. 13C illustrates a sixth example of modifications of the semiconductor elements 20a and 20b.
Figure 13D:
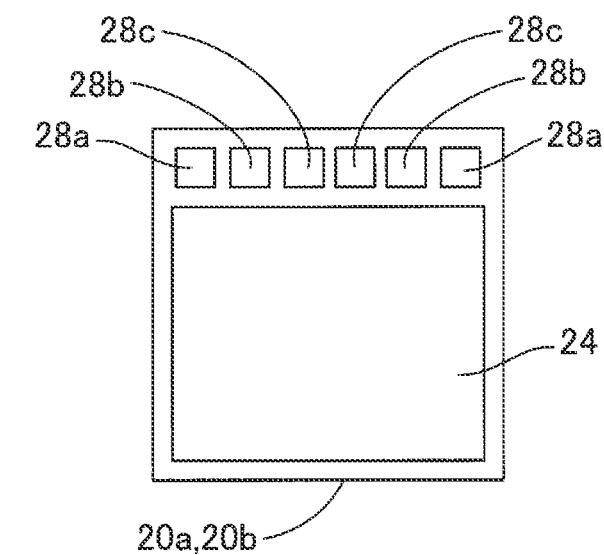
FIG. 13D illustrates a seventh example of modifications of the semiconductor elements 20a and 20b.

As illustrated in FIGS. 13A to 13D, the number and position of signal electrodes 28 can be changed variously. In FIG. 13A, two gate signal electrodes 28a, two sense emitter electrodes 28b, and one kelvin emitter electrode 28c are provided as described above. On the other hand, in a modification illustrated in FIG. 13B, two gate signal electrodes 28a and one kelvin emitter electrode 28c are provided. In a modification illustrated in FIG. 13C, only two gate signal electrodes 28a are provided. In a modification illustrated in FIG. 13D, two gate signal electrodes 28a, two sense emitter electrodes 28b, and two kelvin emitter electrodes 28c are provided. In any of the modifications, the signal electrodes 28a, 28b, 28c having the same function are placed bilaterally symmetrically. Further, various first semiconductor elements 20a and various second semiconductor elements 20b as illustrated in FIGS. 13A to 13D can be also employed in the semiconductor device 210 of Embodiment 3.

Embodiment 5

Figure 14:
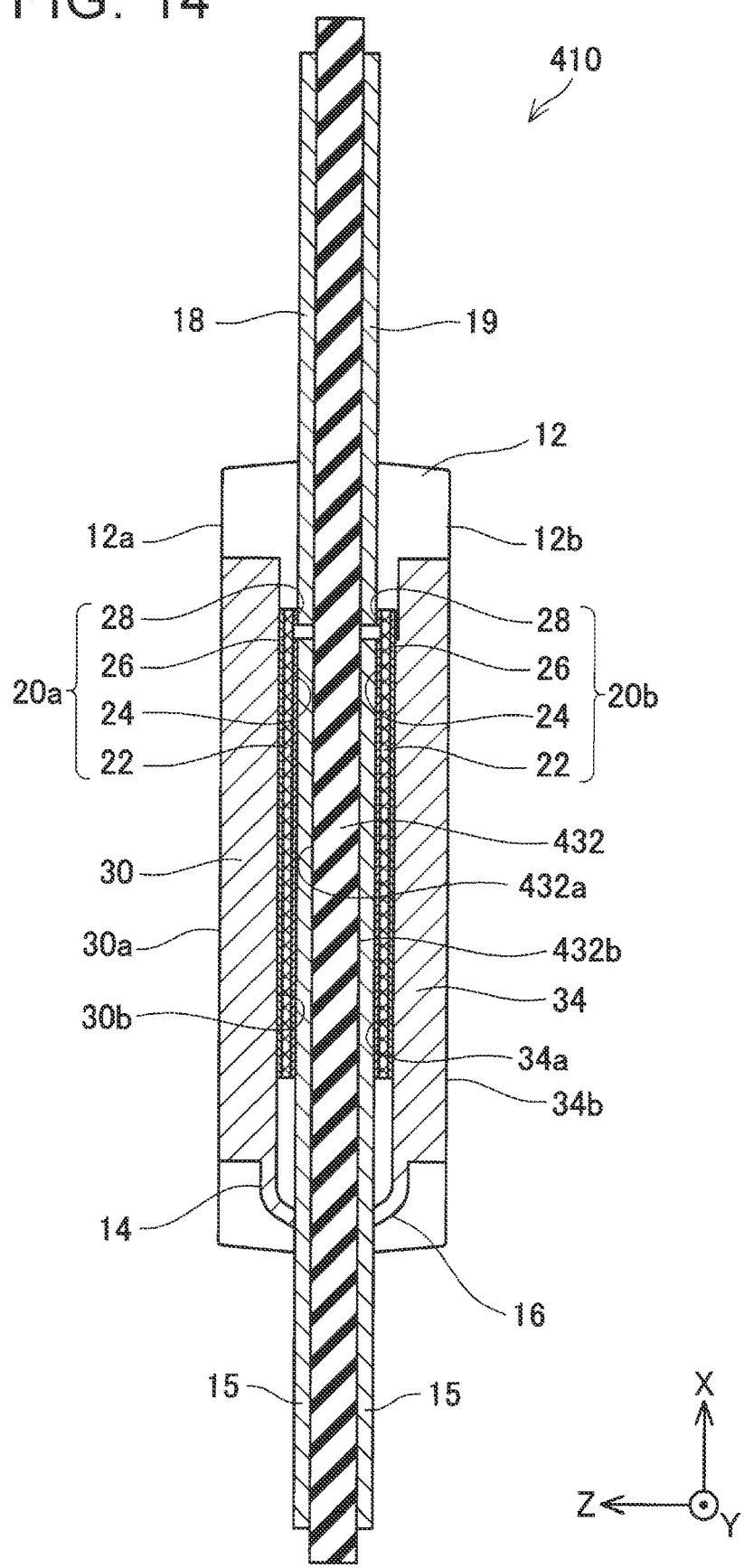
FIG. 14 schematically illustrates a sectional structure of a semiconductor device 410 of Embodiment 5.

With reference to FIG. 14, the following describes a semiconductor device 410 of Embodiment 5. The semiconductor device 410 of the present embodiment is different from the semiconductor device 110 of Embodiment 2 in that the intermediate conductor plate 32 is changed to a circuit substrate 432. The circuit substrate 432 is a direct bonded copper (DBC) substrate or a glass epoxy substrate, for example. The circuit substrate 432 extends so as to pass through the sealing body 12. The first signal terminals 18 connected to the signal electrodes 28 of the first semiconductor element 20a, the upper power terminal 14 connected to the upper conductor plate 30, and the intermediate power terminal 15 connected to the front-surface electrode 24 of the first semiconductor element 20a are provided on a top face 432a of the circuit substrate 432. The second signal terminals 19 connected to the signal electrodes 28 of the second semiconductor element 20b, the lower power terminal 16 connected to the lower conductor plate 34, and the intermediate power terminal 15 connected to the front-surface electrode 24 of the second semiconductor element 20b are provided on a bottom face 432b of the circuit substrate 432.

The semiconductor device 410 of the present embodiment has a function and advantages similar to those of the semiconductor device 110 of Embodiment 2. In addition, since the circuit substrate 432 is employed, various terminals such as the first signal terminals 18 and the second signal terminals 19 can be provided together on the circuit substrate 432. This makes it possible to more easily manufacture the semiconductor device 410, for example.

Embodiment 6

Figure 15:
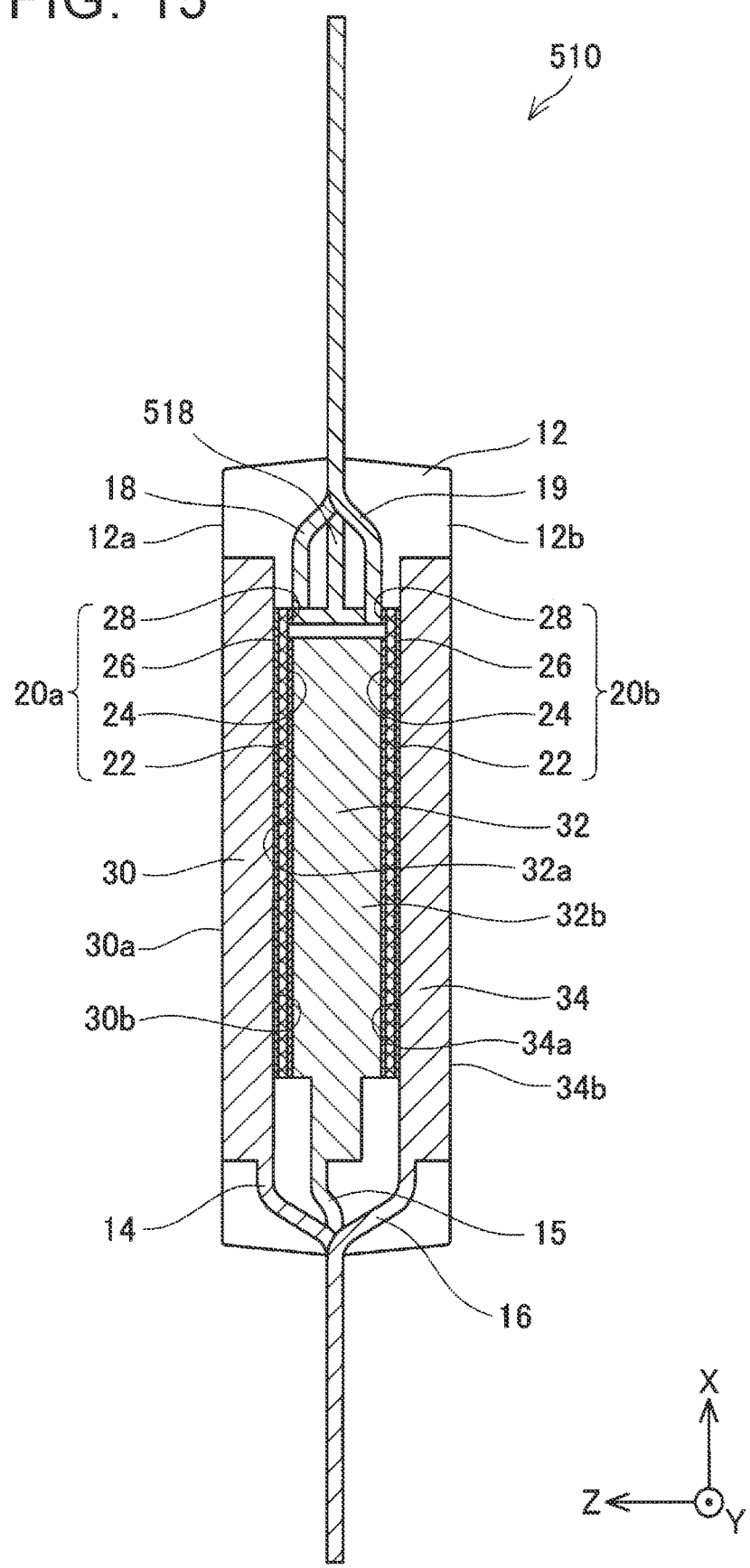
FIG. 15 schematically illustrates a sectional structure of a semiconductor device 510 of Embodiment 6.

With reference to FIG. 15, the following describes a semiconductor device 510 of Embodiment 6. The semiconductor device 510 of the present embodiment is different from the semiconductor devices 10, 110, 210, 310, 410 of the above embodiments in that a common signal terminal 518 is provided. The common signal terminal 518 is connected to the signal electrodes 28 of the first semiconductor element 20a and the signal electrodes 28 of the second semiconductor element 20b. By employing the common signal terminal 518, the sum of signal terminals 18, 19, 518 can be reduced.

The common signal terminal 518 can be easily employed in the semiconductor device 110 of Embodiment 2 and the semiconductor device 310 of Embodiment 4, for example. In the semiconductor devices 110, 310, the second semiconductor element 20b is placed such that the second semiconductor element 20b is reversed back-to-front from the first semiconductor element 20a. Accordingly, at least one of the signal electrodes 28 of the first semiconductor element 20a and at least one of the signal electrodes 28 of the second semiconductor element 20b may face each other. In some embodiments, the common signal terminal 518 may be employed for the signal electrodes 28 facing each other as such. Note that the common signal terminal 518 can be typically employed for two or more signal electrodes 28 (e.g., the aforementioned gate signal electrodes 28a) having the same function.

Embodiment 7

Figure 16:
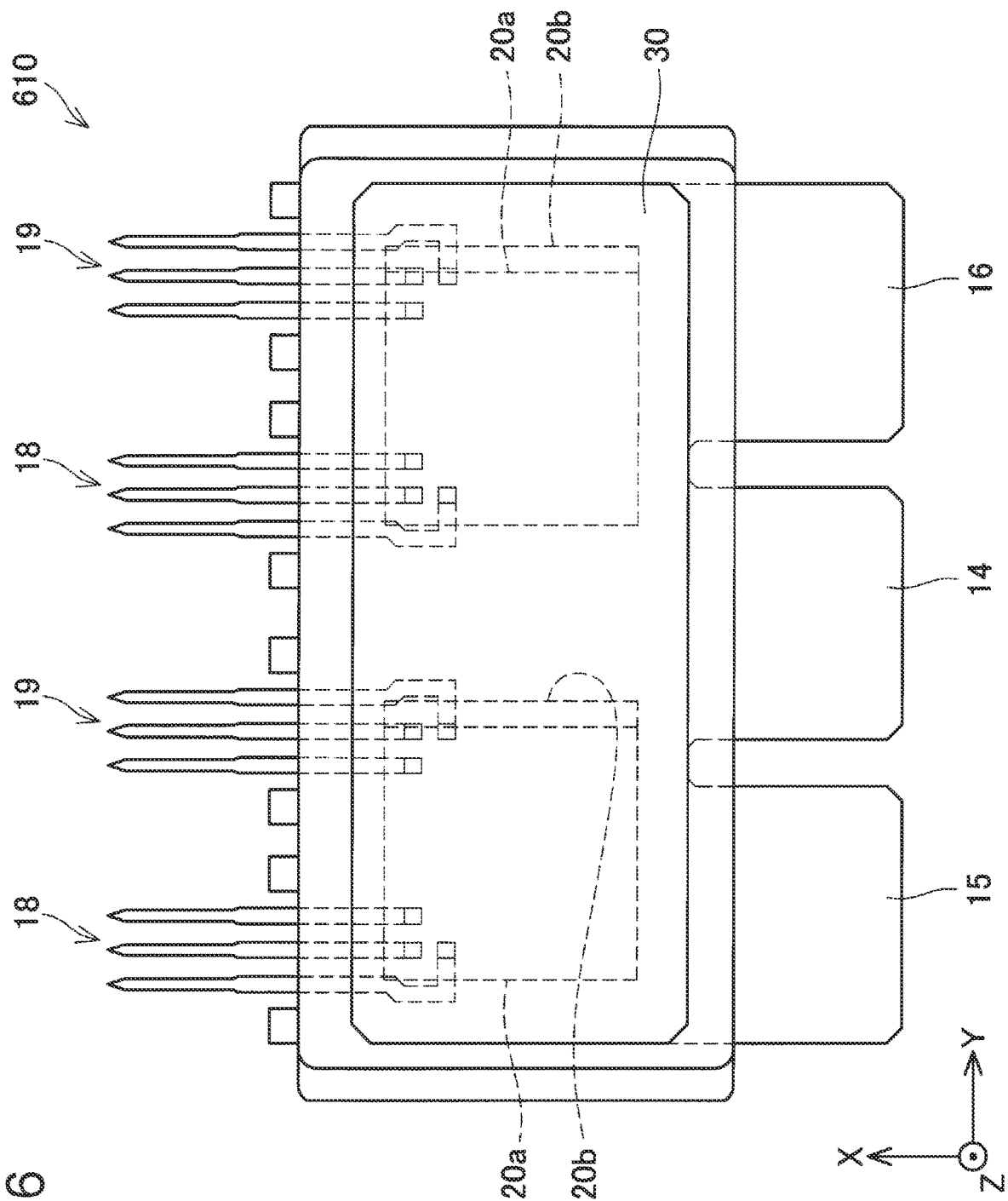
FIG. 16 illustrates a plan view of a semiconductor device 610 of Embodiment 7.
Figure 17:
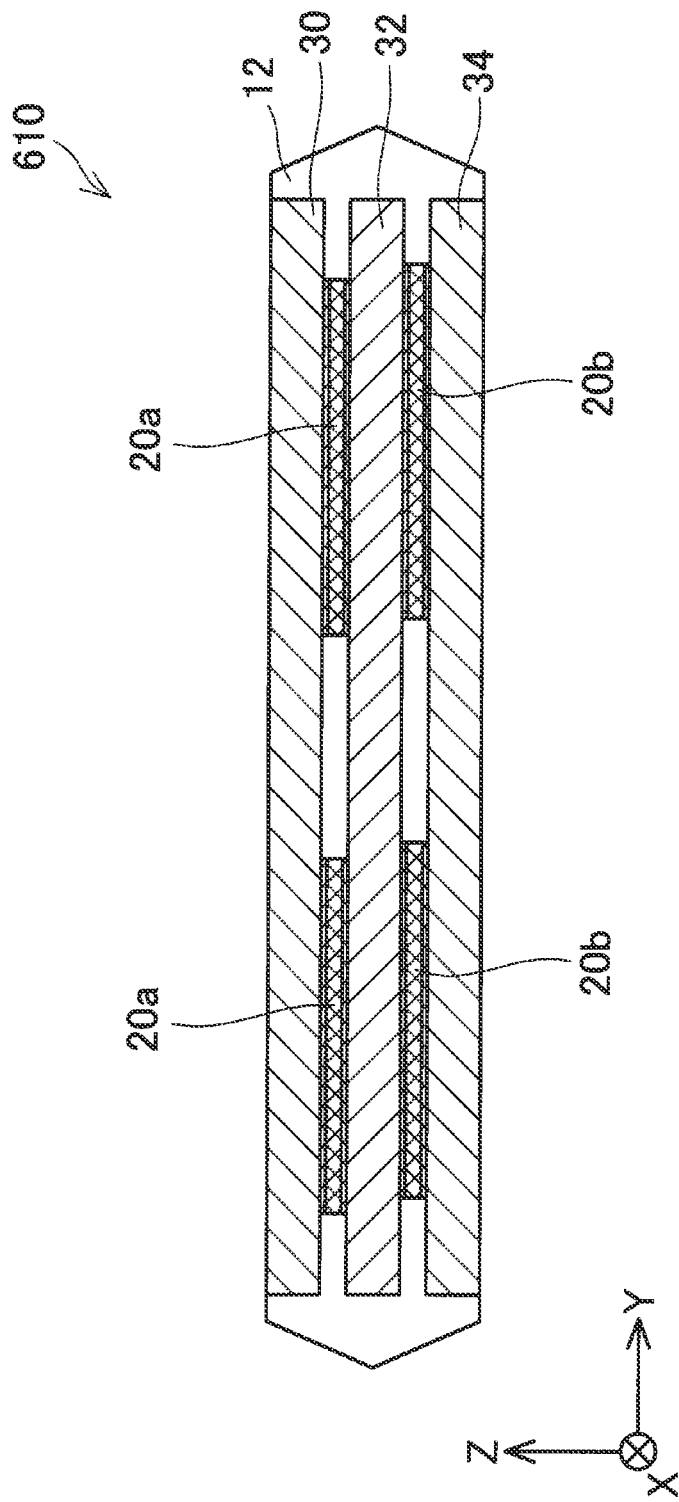
FIG. 17 schematically illustrates a sectional structure of the semiconductor device 610 of Embodiment 7.

With reference to FIGS. 16, 17, the following describes a semiconductor device 610 of Embodiment 7. The semiconductor device 610 of the present embodiment is different from the semiconductor device 10 of Embodiment 1 in that the number of first semiconductor elements 20a and the number of second semiconductor elements 20b are changed.

In the semiconductor device 610, two first semiconductor elements 20a are provided between the upper conductor plate 30 and the intermediate conductor plate 32, and two second semiconductor elements 20b are provided between the intermediate conductor plate 32 and the lower conductor plate 34. Note that the semiconductor device 610 may include three or more first semiconductor elements 20a. Further, the semiconductor device 610 may include three or more second semiconductor elements 20b. The number of first semiconductor elements 20a and the number of second semiconductor elements 20b may be the same or may be different from each other. When the number of first semiconductor elements 20a and/or the number of second semiconductor elements 20b is increased, a current flowing through each of the semiconductor elements 20a, 20b is reduced. Hereby, a rated current (allowable current) of the semiconductor device 610 can be raised.

Embodiment 8

Figure 18:
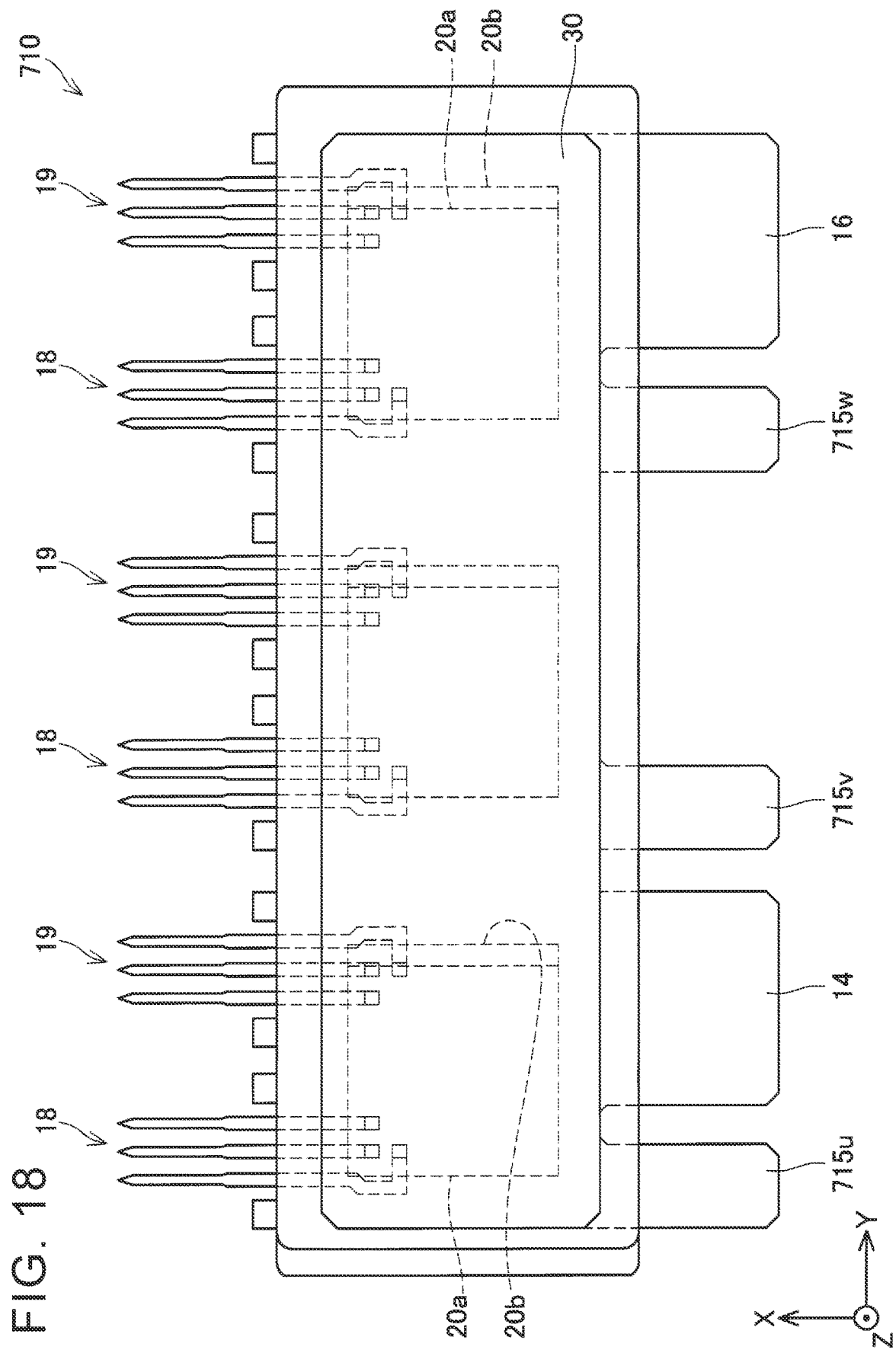
FIG. 18 illustrates a plan view of a semiconductor device 710 of Embodiment 8.
Figure 19:
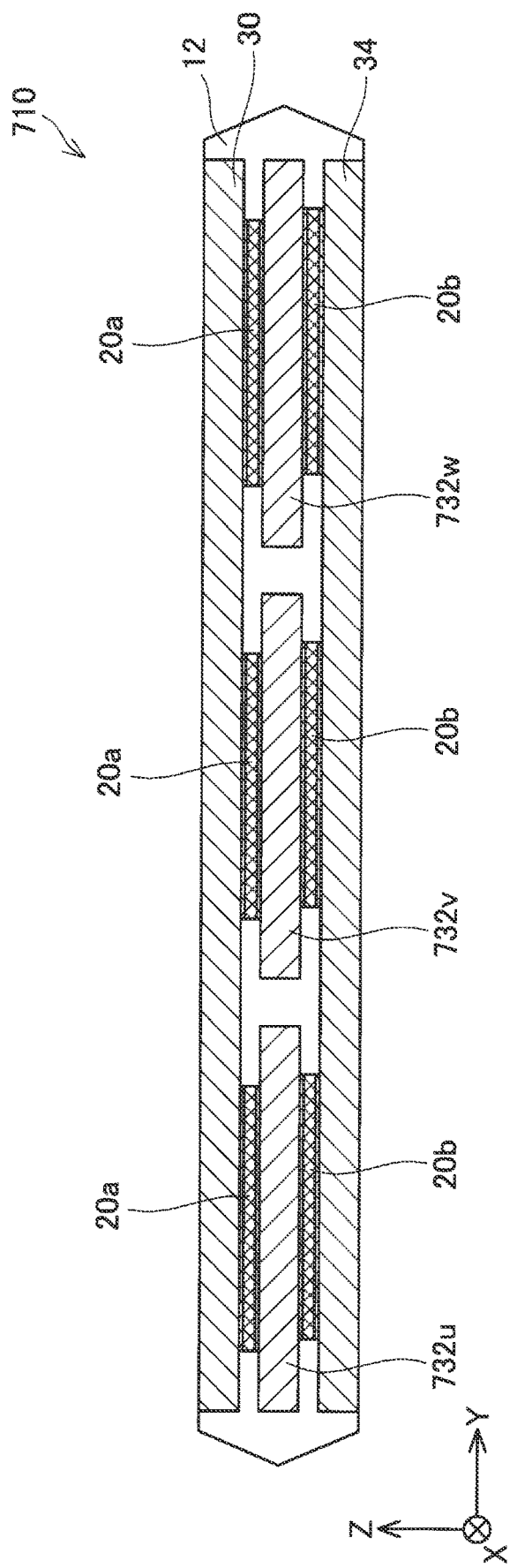
FIG. 19 schematically illustrates a sectional structure of the semiconductor device 710 of Embodiment 8.

With reference to FIGS. 18, 19, the following describes a semiconductor device 710 of Embodiment 8. The semiconductor device 710 of the present embodiment is different from the semiconductor device 10 of Embodiment 1 in that the number of first semiconductor elements 20a and the number of second semiconductor elements 20b are changed, and three first semiconductor elements 20a and three second semiconductor elements 20b are provided. Further, the intermediate conductor plate 32 in Embodiment 1 is divided into three intermediate conductor plates, i.e., a first intermediate conductor plate 732u, a second intermediate conductor plate 732v, and a third intermediate conductor plate 732w. A first intermediate power terminal 715u is connected to the first intermediate conductor plate 732u, a second intermediate power terminal 715v is connected to the second intermediate conductor plate 732v, and a third intermediate power terminal 715w is connected to the third intermediate conductor plate 732w.

In the semiconductor device 710, one of the first semiconductor elements 20a is provided between the upper conductor plate 30 and the first intermediate conductor plate 732u, and one of the second semiconductor elements 20b is provided between the first intermediate conductor plate 732u and the lower conductor plate 34. Further, another one of the first semiconductor elements 20a is provided between the upper conductor plate 30 and the second intermediate conductor plate 732v, and another one of the second semiconductor elements 20b is provided between the second intermediate conductor plate 732v and the lower conductor plate 34. Further, a third one of the first semiconductor elements 20a is provided between the upper conductor plate 30 and the third intermediate conductor plate 732w, and a third one of the second semiconductor elements 20b is provided between the third intermediate conductor plate 732w and the lower conductor plate 34.

The semiconductor device 710 of the present embodiment substantially has such a circuit structure that three semiconductor devices 10 of Embodiment 1 are connected in parallel to each other. As described above, the semiconductor device 10 of Embodiment 1 has a circuit structure in which two RC-IGBTs are serially-connected between the upper power terminal 14 and the lower power terminal 16 and the intermediate power terminal 15 is connected between the two RC-IGBTs. The semiconductor device 10 can constitute upper and lower arms in a power converter circuit such as a DC-DC converter or an inverter, for example. Accordingly, the semiconductor device 710 of the present embodiment has a circuit structure of a three-phase inverter, by itself. Note that, in the semiconductor device 710 of the present embodiment, each of the first semiconductor elements 20a may be changed to a plurality of first semiconductor elements 20a. Similarly, each of the second semiconductor elements 20b may be changed to a plurality of second semiconductor elements 20b. Hereby, a current flowing through each of the semiconductor elements 20a, 20b is reduced, and a rated current (allowable current) of the semiconductor device 710 can be raised.

Embodiment 9

Figure 20:
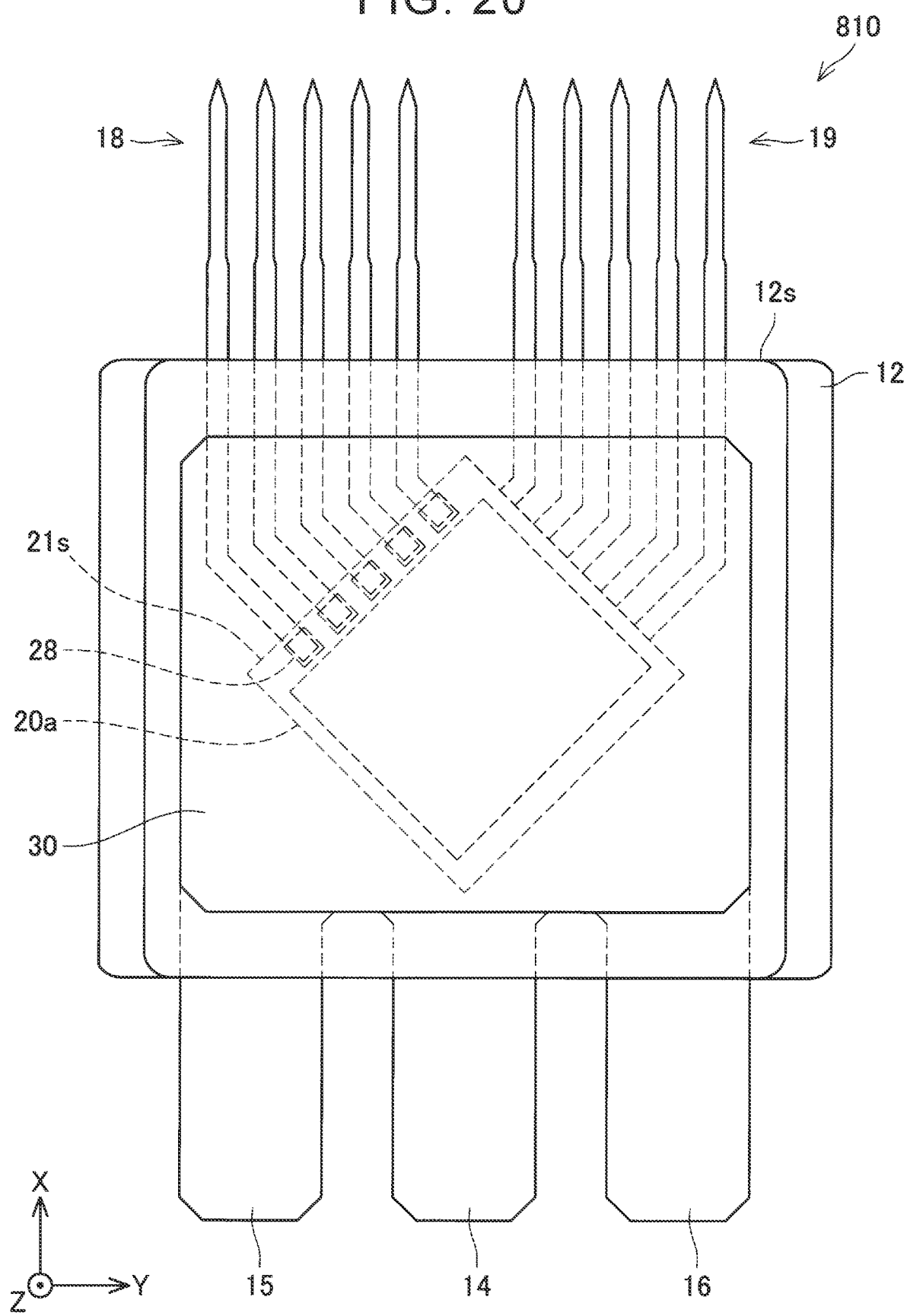
FIG. 20 illustrates a plan view of a semiconductor device 810 of Embodiment 9.
Figure 21:
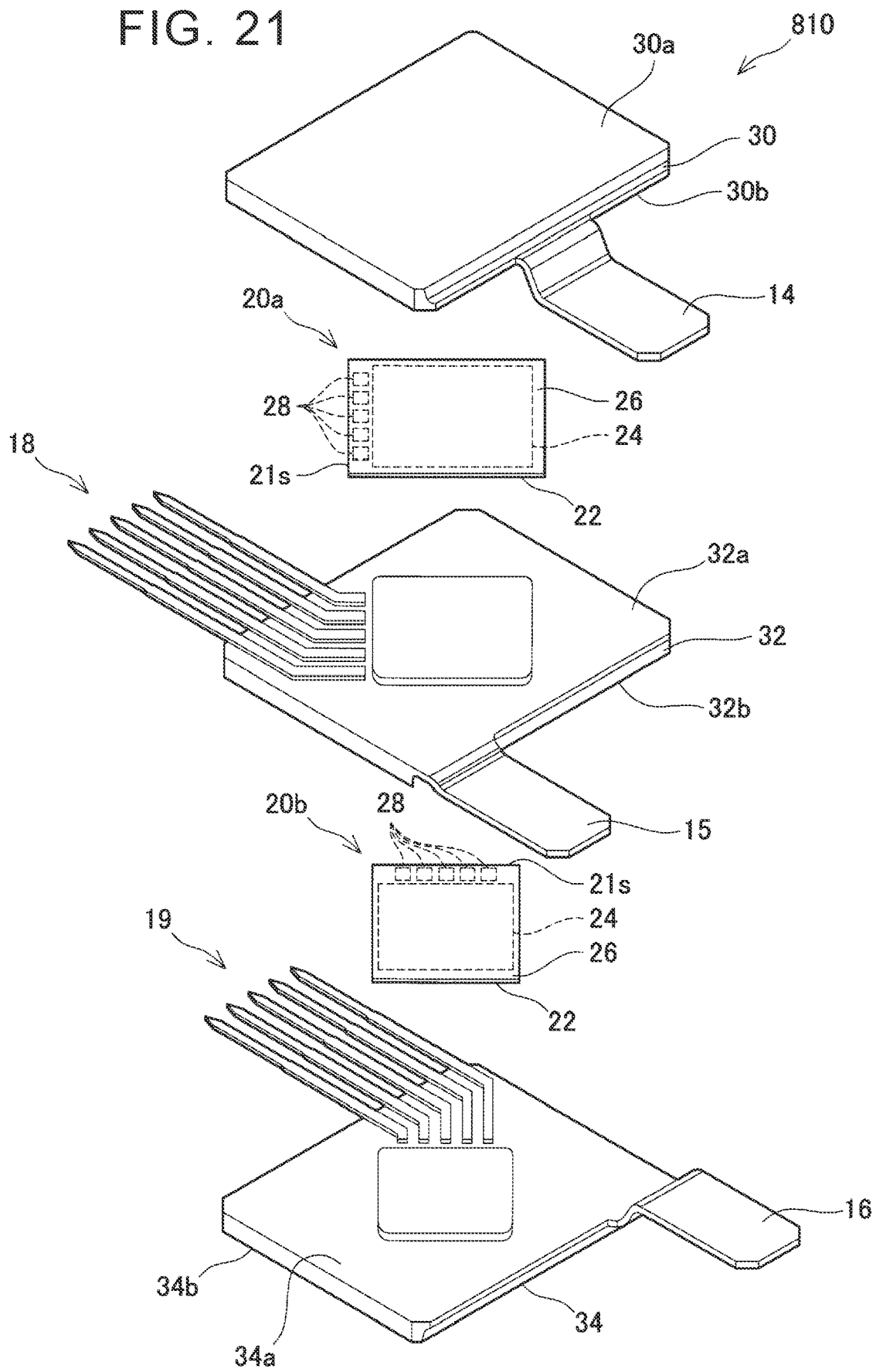
FIG. 21 illustrates an exploded view of the semiconductor device 810 of Embodiment 9.

With reference to FIGS. 20, 21, the following describes a semiconductor device 810 of Embodiment 9. Similarly to the semiconductor device 10 of Embodiment 1, the semiconductor device 810 of the present embodiment includes the first semiconductor element 20a, the second semiconductor element 20b laminated to the first semiconductor element 20a, and the sealing body 12 configured to seal the first semiconductor element 20a and the second semiconductor element 20b. Further, the semiconductor device 810 includes the first signal terminals 18 connected to the signal electrodes 28 of the first semiconductor element 20a, and the second signal terminals 19 connected to the signal electrodes 28 of the second semiconductor element 20b. When the first signal terminals 18 and the second signal terminals 19 are planarly viewed along the laminating direction (the Z-direction) of the first semiconductor element 20a and the second semiconductor element 20b, the first signal terminals 18 and the second signal terminals 19 project from the sealing body 12 toward the first direction (the X-direction) and are distanced from each other in the second direction (the Y-direction) that is perpendicular to the first direction (the X-direction).

In the meantime, the semiconductor device 810 of the present embodiment is different from the semiconductor device 10 of Embodiment 1 in that the configuration of the first semiconductor element 20a and the second semiconductor element 20b is changed. That is, in the present embodiment, the semiconductor element 20a, 20b includes five signal electrodes 28. The five signal electrodes 28 are arranged in line along one side 21s of the semiconductor element 20a, 20b. Along with this, the number of first signal terminals 18 and the number of second signal terminals 19 are also changed to five. Note that the number of signal electrodes 28 and the number of the signal terminals 18, 19 are not limited to five as long as at least two signal electrodes 28 are arranged in line along the one side 21s of the semiconductor element 20a, 20b.

Further, the semiconductor device 810 of the present embodiment is different from the semiconductor device 10 of Embodiment 1 in that the orientations of the first semiconductor element 20a and the second semiconductor element 20b are changed. More specifically, the first semiconductor element 20a is placed so as to be rotated by 45 degrees in one direction, and the second semiconductor element 20b is placed so as to be rotated by 45 degrees in an opposite direction to the one direction. Hereby, the one side 21s of the semiconductor element 20a, 20b is not parallel to one side surface 12s of the sealing body 12, and forms an angle of 45 degrees with respect to the one side surface 12s. Here, the one side 21s of the semiconductor element 20a, 20b is a side along which the signal electrodes 28 are arranged. The one side surface 12s of the sealing body 12 is a surface from which the first signal terminals 18 and the second signal terminals 19 project. That is, in the semiconductor device 810 of the present embodiment, the arrangement direction of the signal electrodes 28 in the semiconductor element 20a, 20b forms an angle of 45 degrees with respect to the arrangement direction of the signal terminals 18, 19 projecting from the sealing body 12.

Similarly to the semiconductor device 10 of Embodiment 1, in the semiconductor device 810 of the present embodiment, the second semiconductor element 20b is placed at an angle of 90 degrees shifted from the first semiconductor element 20a. Hereby, the signal electrodes 28 of the first semiconductor element 20a and the signal electrodes 28 of the second semiconductor element 20b are placed at different positions in terms of the arrangement direction (the Y-direction) of the signal terminals 18, 19. The signal electrodes 28 of the first semiconductor element 20a are provided so as to be closer to the first signal terminals 18 than to the second signal terminals 19, and the signal electrodes 28 of the second semiconductor element 20b are provided so as to be closer to the second signal terminals 19 than to the first signal terminals 18. With such a configuration, even in a case where the first semiconductor element 20a and the second semiconductor element 20b are provided in a laminated manner, the first signal terminals 18 and the second, signal terminals 19 connected to the first semiconductor element 20a and the second semiconductor element 20b, respectively, can be placed so as to be distanced from each other. Since the first signal terminals 18 and the second signal terminals 19 do not overlap with each other, the first signal terminals 18 can be easily connected to the signal electrodes 28 of the first semiconductor element 20a, and the second signal terminals 19 can be easily connected to the signal electrodes 28 of the second semiconductor element 20b. Accordingly, the configurations of the first signal terminals 18 and the second signal terminals 19 can be made simple. Further, since the first signal terminals 18 and the second signal terminals 19 are distanced from each other, it is possible to restrain electromagnetic interference (so-called noise) that can occur between the first signal terminals 18 and the second signal terminals 19.

Particularly, in the semiconductor device 810 of the present embodiment, the first semiconductor element 20a is rotated to the one direction so as to be placed diagonally. Hereby, the first signal terminals 18 connected to the first semiconductor element 20a can be placed, in a biased manner, on a first side of the one side surface 12s of the sealing body 12. Similarly, the second semiconductor element 20b is rotated to the opposite direction so as to be placed diagonally. Hereby, the second signal terminals 19 connected to the second semiconductor element 20b can be placed, in a biased manner, on a second side of the one side surface 12s of the sealing body 12. Further, since the signal electrodes 28 of the first semiconductor element 20a and the signal electrodes 28 of the second semiconductor element 20b do not overlap with each other, the first signal terminals 18 or the second signal terminals 19 can be easily connected to their corresponding signal electrodes 28.

Note that the first signal terminals 18 may be connected to the signal electrodes 28 of the first semiconductor element 20a via bonding wires or other connection members. Alternatively, like the present embodiment, the first signal terminals 18 may be directly connected to the signal electrodes 28 of the first semiconductor element 20a. Similarly, the second signal terminals 19 may be connected to the signal electrodes 28 of the second semiconductor element 20b via bonding wires or other connection members. Alternatively, like the present embodiment, the second signal terminals 19 may be directly connected to the signal electrodes 28 of the second semiconductor element 20b.

As understood from the above description, in the semiconductor device 810 of the present embodiment, the first semiconductor element 20a and the second semiconductor element 20b have the same configuration and include respective signal electrodes 28 arranged in line. The arrangement direction of the signal electrodes 28 in the first semiconductor element 20a and the arrangement direction of the signal electrodes 28 in the second semiconductor element 20b form an angle of 45 degrees with respect the second direction (the Y-direction), However, this angle is not limited to 45 degrees and may be other angles such as 30 degrees or 60 degrees, for example. At this time, the arrangement direction of the signal electrodes 28 in the first semiconductor element 20a and the arrangement direction of the signal electrodes 28 in the second semiconductor element 20b may not be parallel to each other and may form different angles with respect to the second direction (the Y-direction).

The structure described in the present embodiment, particularly, the structure in which the semiconductor element 20a, 20b is placed diagonally, may be employed only for one of the semiconductor elements 20a, 20b. Alternatively, this structure can be effectively employed in other semiconductor devices including a single semiconductor element. When the arrangement direction of signal electrodes in a semiconductor element forms an angle of 30 degrees, 45 degrees, 60 degrees, or the like with respect to the arrangement direction of signal terminals connected to the semiconductor element, the signal terminals can be placed, in a biased manner, at a desired position in a sealing body without or extending or complicating the signal terminals.

Figure 22:
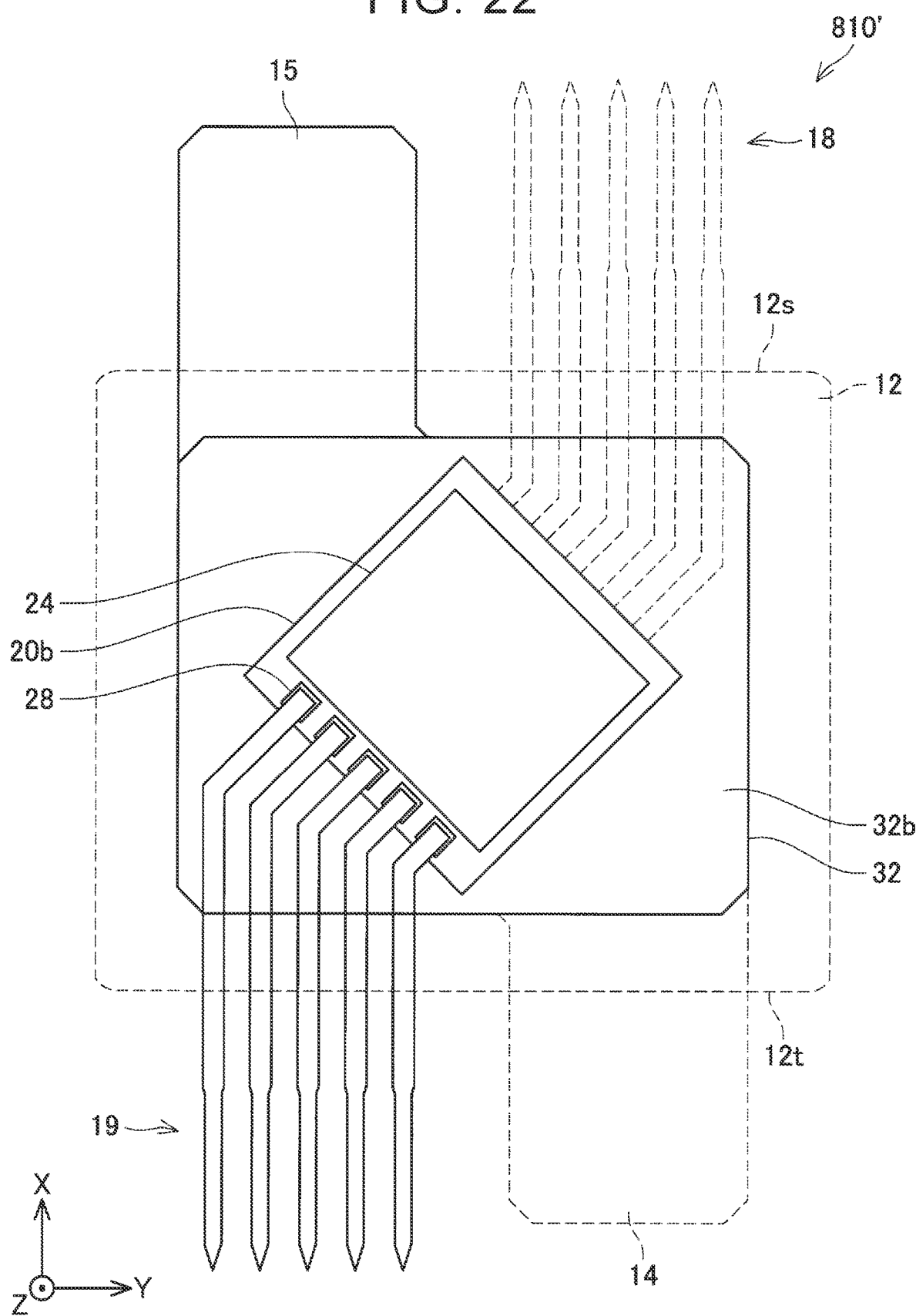
FIG. 22 schematically illustrates a structure of a semiconductor device 810' of one modification.

FIG. 22 schematically illustrates a configuration of a semiconductor device 810' of one modification. The semiconductor device 810' is different from the semiconductor device 810 of Embodiment 9 in that the first semiconductor element 20a or the second semiconductor element 20b is further rotated by 90 degrees, so that the second semiconductor element 20b is placed with a posture rotated by 180 degrees from the first semiconductor element 20a. In this case, while the first signal terminals 18 connected to the first semiconductor element 20a project from the one side surface 12s of the sealing body 12, the second signal terminals 19 connected to the second semiconductor element 20b may project from a side surface 12t of the sealing body 12 on the opposite side from the one side surface 12s. With such a configuration, the distance between the first signal terminals 18 and the second signal terminals 19 can be made larger without complicating the structures of the first signal terminals 18 and the second signal terminals 19.

Some specific examples of the disclosure have been described in detail. However, the examples are for illustration only and do not limit the scope of the claims. The technique described in the scope of the claims includes the foregoing examples with various modifications and changes. Technical elements described in the present specification or the drawings exhibit a technical usability solely or in various combinations.

What is claimed is:

1. A semiconductor device comprising:
   a first semiconductor element including a first signal electrode;
   a second semiconductor element including a second signal electrode, the second semiconductor element being laminated on the first semiconductor element;
   a sealing body configured to seal the first semiconductor element and the second semiconductor element;
   a first signal terminal connected to the first signal electrode; and
   a second signal terminal connected to the second signal electrode, wherein:
   the first signal terminal and the second signal terminal project from the sealing body and extend in a first direction;
   the first signal terminal and the second signal terminal are distanced from each other in a second direction, the second direction being a direction perpendicular to the first direction and a laminating direction of the first semiconductor element and the second semiconductor element;
   the first signal electrode and the second signal electrode are placed at different positions in the second direction;
   the first signal electrode is provided closer to the first signal terminal than to the second signal terminal; and
   the second signal electrode is provided closer to the second signal terminal than to the first signal terminal,
   wherein:
      the first semiconductor element and the second semiconductor element have the same configuration,
      the second semiconductor element is placed at an angle 90 degrees shifted from the first semiconductor element,
      at least one signal electrode of a plurality of signal electrodes is provided closer to one corner part than to the other corner parts among four corner parts of the first semiconductor element, the signal electrodes being included in the first signal electrode, and
      all the signal electrodes included in the first signal electrode are provided closer to the one corner part than to the other corner parts among the four corner parts of the first semiconductor element.

2. The semiconductor device according to claim 1, wherein:
   the second semiconductor element is provided such that the second semiconductor element is reversed back-to-front from the first semiconductor element.

3. The semiconductor device according to claim 1, wherein the at least one signal electrode provided closer to the one corner part than to the other corner parts is provided symmetrically with respect to a bisector of the one corner part.

4. The semiconductor device according to claim 1, further comprising a power terminal electrically connected to the first semiconductor element, wherein the power terminal is placed on an opposite side from the first signal terminal across the sealing body.

* * * * *